(12) United States Patent
Nishimura et al.

(10) Patent No.: US 11,251,776 B2
(45) Date of Patent: Feb. 15, 2022

(54) RESONATOR AND RESONANCE DEVICE

(71) Applicant: Murata Manufacturing Co., Ltd., Nagaokakyo (JP)

(72) Inventors: Toshio Nishimura, Nagaokakyo (JP); Ville Kaajakari, Altadena, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 1027 days.

(21) Appl. No.: 15/904,975

(22) Filed: Feb. 26, 2018

(65) Prior Publication Data

US 2018/0191330 A1    Jul. 5, 2018

Related U.S. Application Data

(63) Continuation of application No. PCT/JP2016/068476, filed on Jun. 22, 2016.
(Continued)

(51) Int. Cl.
*H03H 9/24* (2006.01)
*H03H 9/02* (2006.01)
(Continued)

(52) U.S. Cl.
CPC ...... *H03H 9/2405* (2013.01); *H03H 9/02433* (2013.01); *H03H 9/0595* (2013.01); *H03H 9/1057* (2013.01); *H03H 2009/0244* (2013.01)

(58) Field of Classification Search
CPC ............ H03H 9/2405; H03H 9/02433; H03H 9/0595; H03H 9/1035; H03H 9/1057; H03H 2009/0244
See application file for complete search history.

(56) References Cited

U.S. PATENT DOCUMENTS

| 4,350,918 A | 9/1982 | Sato |
| 4,609,844 A | 9/1986 | Nakamura et al. |

(Continued)

FOREIGN PATENT DOCUMENTS

| JP | S55-85119 A | 6/1980 |
| JP | H08-186487 A | 7/1996 |

(Continued)

OTHER PUBLICATIONS

International Search Report issued for PCT/JP2016/068476, dated Sep. 13, 2016.

(Continued)

*Primary Examiner* — Jeffrey M Shin
(74) *Attorney, Agent, or Firm* — Arent Fox LLP

(57) ABSTRACT

A resonator that includes a piezoelectric vibrator, a frame, and a first node generator between the piezoelectric vibrator and the frame. Moreover, a first connecting arm connects the first node generator to the piezoelectric vibrator that opposes the first, and a first holding arm connects the first node generator to a part of the frame that opposes the first node generator. The first node generator includes a width extending in a second direction, which is orthogonal to a first direction of the first connecting arm, that is a maximum width where the first node generator is closer to the first connecting arm than a center of the first node generator relative to the first direction. Moreover, the width of the first node generator gradually decreases from the maximum width as the first node generator extends towards the first holding arm.

20 Claims, 14 Drawing Sheets

Related U.S. Application Data

(60) Provisional application No. 62/221,331, filed on Sep. 21, 2015.

(51) Int. Cl.
*H03H 9/05* (2006.01)
*H03H 9/10* (2006.01)

(56) References Cited

U.S. PATENT DOCUMENTS

| | | | |
|---|---|---|---|
| 5,548,180 | A | 8/1996 | Kaida |
| 7,639,105 | B2 | 12/2009 | AYAZl et al. |
| 7,843,284 | B2 | 11/2010 | AYAZl et al. |
| 8,446,078 | B2 | 5/2013 | Gaidarzhy et al. |
| 2008/0079344 | A1 | 4/2008 | Zalud |
| 2010/0156566 | A1* | 6/2010 | Abdolvand .......... H03H 9/2405 333/195 |
| 2010/0314969 | A1 | 12/2010 | Gaidarzhy et al. |
| 2011/0204999 | A1 | 8/2011 | Phan Le et al. |
| 2012/0068578 | A1 | 3/2012 | Takahashi |
| 2013/0285676 | A1 | 10/2013 | Rahafrooz et al. |
| 2016/0111627 | A1 | 4/2016 | Hase |
| 2016/0322954 | A1 | 11/2016 | Kaida et al. |

FOREIGN PATENT DOCUMENTS

| | | |
|---|---|---|
| JP | 2003-198300 A | 7/2003 |
| JP | 2009-100196 A | 5/2009 |
| JP | 2010-232943 A | 10/2010 |
| JP | 2012-080166 A | 4/2012 |
| JP | 2012-151651 A | 8/2012 |
| JP | 2014-50067 A | 3/2014 |
| JP | 2014-068098 A | 4/2014 |
| WO | WO 2015/002261 A1 | 1/2015 |

OTHER PUBLICATIONS

Written Opinion of the International Searching Authority issued for PCT/JP2016/068476, dated Sep. 13, 2016.
International Search Report issued in International Application No. PCT/JP2016/060262, dated Jun. 21, 2016.
International Search Report issued in International Patent Application No. PCT/JP2016/060269, dated Jun. 21, 2016.
Written Opinion of the International Searching Authority issued in International Application No. PCT/JP2016/060262, dated Jun. 21, 2016.
Written Opinion of the International Searching Authority issued in International Patent Application No. PCT/JP2016/060269, dated Jun. 21, 2016.

* cited by examiner

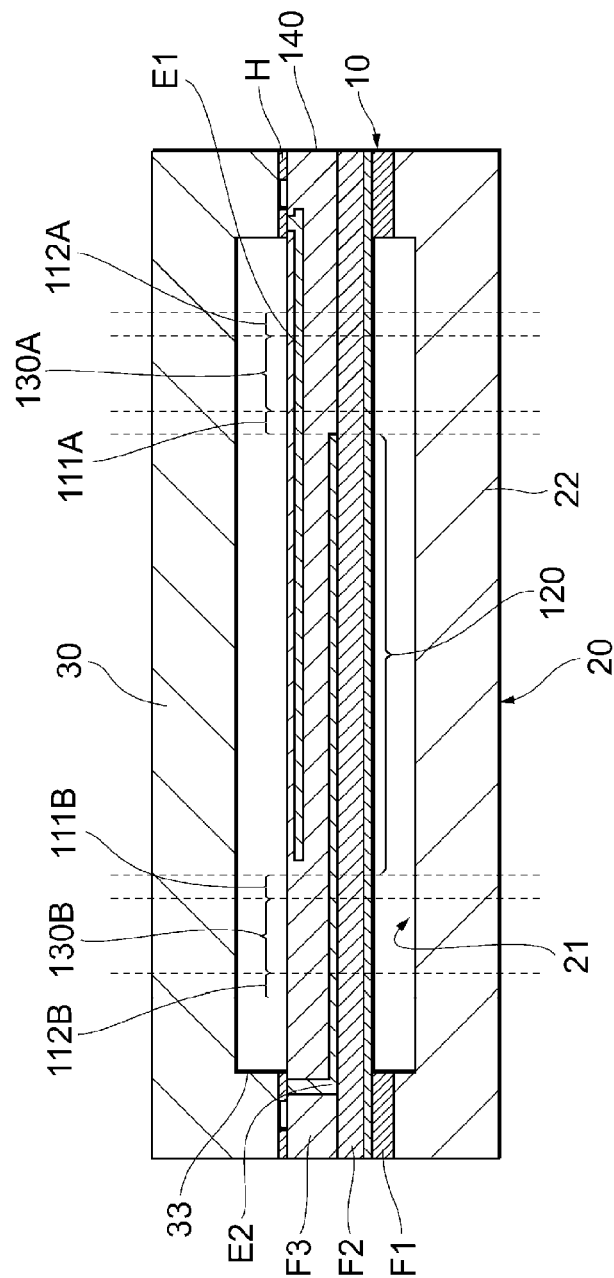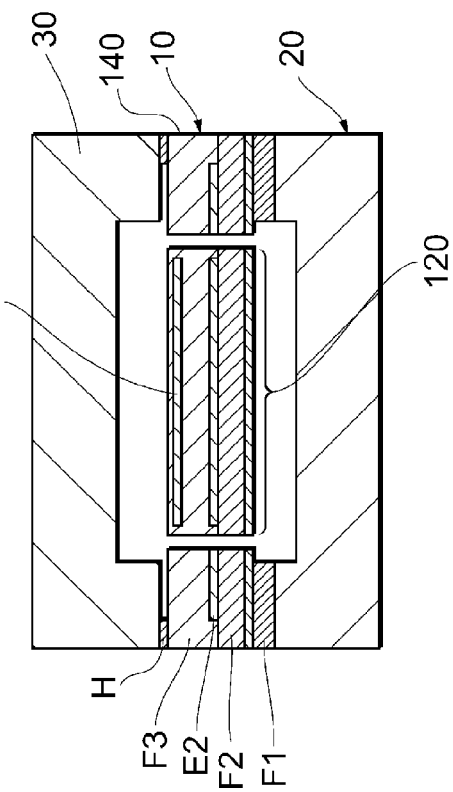
FIG. 5(A)
FIG. 5(B)

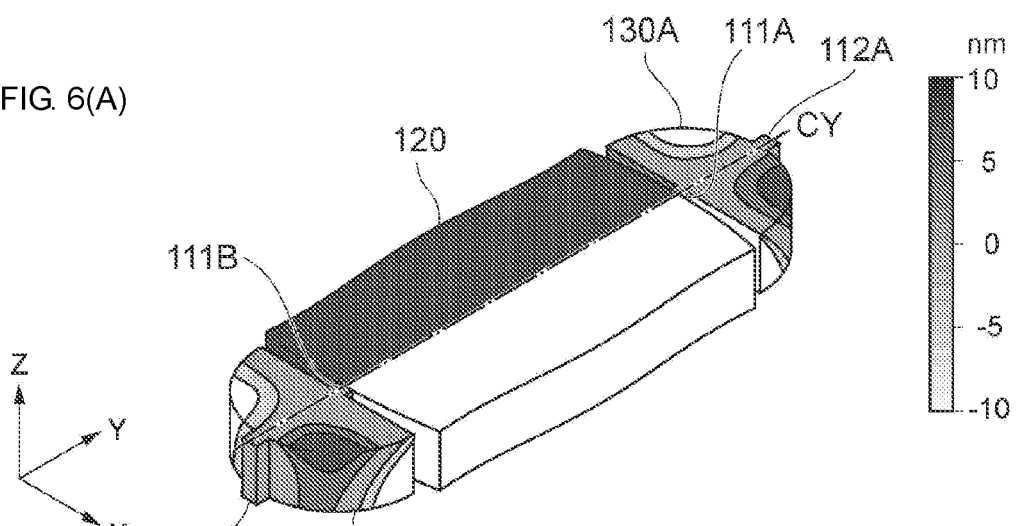
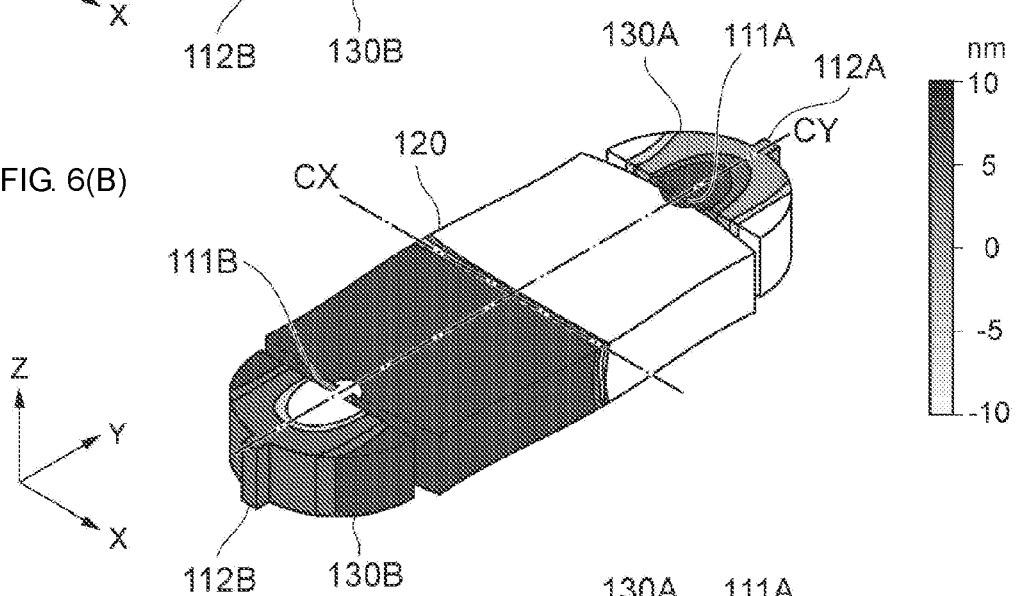
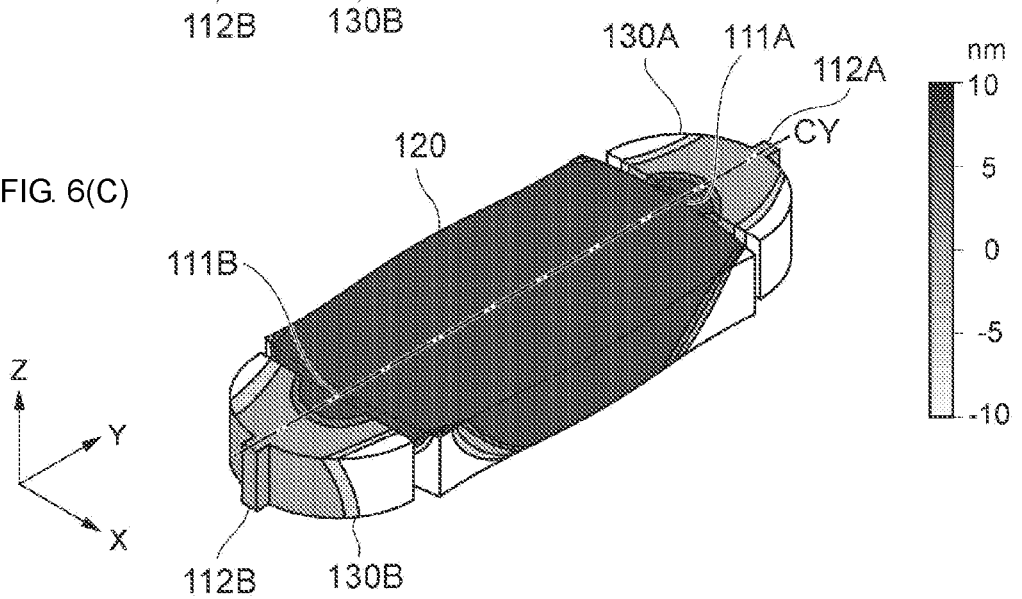

RESONATOR AND RESONANCE DEVICE

CROSS REFERENCE TO RELATED APPLICATIONS

The present application is a continuation of PCT/JP2016/068476 filed Jun. 22, 2016, which claims priority to U.S. Provisional Patent Application No. 62/221,331, filed Sep. 21, 2015, the entire contents of each of which are incorporated herein by reference.

TECHNICAL FIELD

The present disclosure relates to a resonator and a resonance device in which a vibrating portion vibrates in an in-plane vibration mode.

BACKGROUND

Resonance devices that use micro electro mechanical systems (MEMS) technologies are used as timing devices, for example. Such resonance devices are mounted on a printed board installed in an electronic device, such as a smart phone. These resonance devices includes a lower substrate, an upper substrate arranged to form a cavity between the lower substrate and the upper substrate, and a resonator disposed in the cavity between the lower substrate and the upper substrate.

Patent Document 1 (identified below), for example, discloses a resonator that includes a vibrating body having a rectangular cross section and that is capable of effectively exciting vibration in a width expansion mode by setting the ratio b/a of a length b of the long sides of the rectangle to a length a of the short sides of the rectangle in a specific range.

Patent Document 1: U.S. Pat. No. 5,548,180.

In conventional resonators, a rectangular vibrating portion (vibrating body) is connected to a holding portion by holding arms. In these resonators, vibration leakage occurs since the vibrating portion is held by the holding arms, and anchor loss occurs accordingly. As a result, the Q factor of the resonator is reduced. In the resonator described in Patent Document 1, the aspect ratio of the vibrating body is optimized so that nodes are generated near the centers of the sides parallel to the vibration direction of the vibrating body. However, the direction perpendicular to the vibration direction and the thickness direction of the vibrating body are not taken into consideration, and anchor loss still occurs.

SUMMARY OF THE INVENTION

The exemplary embodiments of the present disclosure have been made in light of the above-described circumstances, with the objective of increasing the Q factor of a resonator by reducing anchor loss.

Thus, a resonator according to an exemplary aspect invention includes a piezoelectric vibrator; a frame provided in at least a part of a region around the piezoelectric vibrating portion; a first node generator provided between the piezoelectric vibrator and the frame; a first connecting arm that connects the first node generator to a part of the piezoelectric vibrator that opposes the first node generator; and a first holding arm that connects the first node generator to a part of the frame that opposes the first node generator. The first node generator includes a part at which a length of the first node generator in a second direction, which is orthogonal to a first direction in which the first connecting arm connects the first node generator to the piezoelectric vibrator, is at a maximum, the part being closer to the first connecting arm than a center of the first node generator in the first direction is, the length of the first node generator in the second direction gradually decreasing with increasing distance from the part at which the length is at the maximum toward the first holding arm.

In this resonator, nodes of vibrations of the piezoelectric vibrating portion in the X-axis, Y-axis, and Z-axis directions may be formed on the node forming portion. Accordingly, anchor loss that occurs when the vibrating portion is held by the holding portion can be reduced, and the Q factor can be increased.

Preferably, the resonator further includes a second node generator provided between the piezoelectric vibrator and the frame, the second node generator opposing a surface of the piezoelectric vibrator that is opposite a surface of the piezoelectric vibrator that opposes the first node generator; a second connecting arm that connects the piezoelectric vibrator to the second node generator; and a second holding arm that connects the second node generator to a part of the frame that opposes the second node generator. The second node generator includes a part at which a length of the second node generator in the second direction is at a maximum, the part being closer to the second connecting arm than a center of the second node generator in the first direction is, the length of the second node generator in the second direction gradually decreasing with increasing distance from the part at which the length is at the maximum toward the second holding arm. In the resonator according to this preferred embodiment, nodes of vibrations of the piezoelectric vibrating portion in the X-axis, Y-axis, and Z-axis directions may be formed on the first and second node generators. Accordingly, anchor loss that occurs when the piezoelectric vibrator is held by the frame can be reduced, and the Q factor can be increased.

The first node generator preferably has a shape of a circular segment, and is connected to the first connecting arm in a vicinity of a midpoint of a chord of the circular segment and to the first holding arm in a vicinity of a vertex of an arc of the circular segment. The second node generator preferably has a shape of a circular segment, and is connected to the second connecting arm in a vicinity of a midpoint of a chord of the circular segment and to the second holding arm in a vicinity of a vertex of an arc of the circular segment. In this case, anchor loss that occurs when the piezoelectric vibrator is held by the frame can be further reduced.

The first node generator preferably has a shape of a triangle, and is connected to the first connecting arm in a vicinity of a midpoint of a base of the triangle and to the first holding arm in a vicinity of a vertex of the triangle. The second node generator has a shape of a triangle, and is connected to the second connecting arm in a vicinity of a midpoint of a base of the triangle and to the second holding arm in a vicinity of a vertex of the triangle. In this case, anchor loss that occurs when the piezoelectric vibrator is held by the frame can be reduced.

In each of the first node generator and the second node generator, the length at the part at which the length in the second direction is at the maximum is preferably less than a length of the piezoelectric vibrator in the second direction. In this preferred embodiment, the anchor loss can be further reduced.

The piezoelectric vibrator is preferably formed by laminating a piezoelectric thin film and a pair of electrodes that oppose each other with the piezoelectric thin film interposed therebetween. The first node generator and the second node generator are preferably formed by laminating the piezoelectric thin film and the electrodes.

The piezoelectric vibrator preferably has a shape of a rectangle, and includes a plurality of vibrating regions along a direction of long sides of the rectangle. Each of the first connecting arm and the second connecting arm preferably includes a first arm that extends substantially parallel to the direction of the long sides, a plurality of second arms that connect the first arm to the plurality of vibrating regions, and a third arm that connects the first arm to the first node generator or the second node generator. In each of the first node generator and the second node generator, the length at the part at which the length in the second direction is at the maximum is preferably greater than a width of the third arm.

A resonance device according to an exemplary aspect of the present disclosure invention can include any of the above-described resonators.

According to this resonance device, the anchor loss can be reduced and the Q factor can be increased.

According to the exemplary embodiments of the present disclosure, the Q factor of the resonator can be increased by reducing the anchor loss.

BRIEF DESCRIPTION OF DRAWINGS

FIGS. 5(a) and 5(b) show sectional views of FIG. 1.

FIGS. 6(a)-6(c) are diagrams illustrating displacements of the resonator according to the first exemplary embodiment.

DETAILED DESCRIPTION OF EMBODIMENTS

First Embodiment

Figure 1:
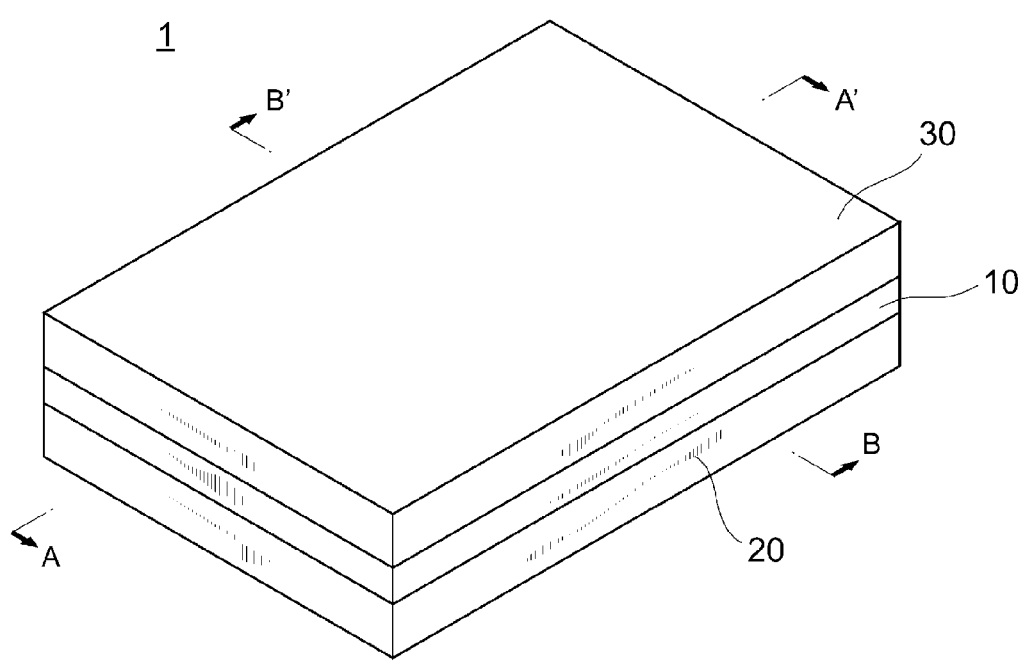
FIG. 1 is a schematic perspective view illustrating the appearance of a resonance device according to a first exemplary embodiment.
Figure 2:
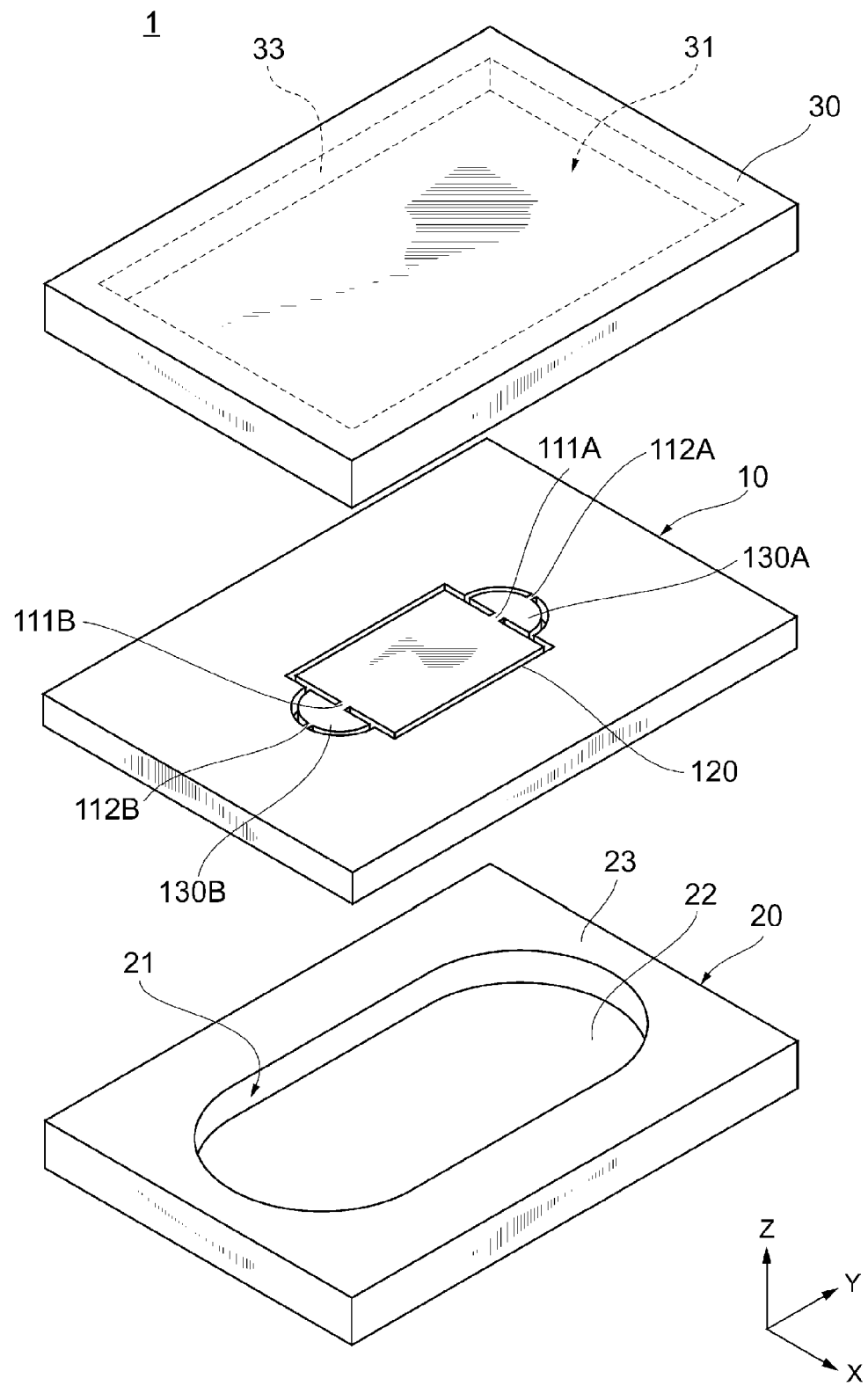
FIG. 2 is a schematic exploded perspective view illustrating the structure of the resonance device according to the first exemplary embodiment.

A first exemplary embodiment will now be described with reference to the accompanying drawings. FIG. 1 is a schematic perspective view illustrating the appearance of a resonance device 1 according to a first exemplary embodiment. FIG. 2 is a schematic exploded perspective view illustrating the structure of the resonance device 1 according to the first exemplary embodiment.

The resonance device 1 includes a resonator 10, an upper cover 30, and a lower cover 20. The resonator 10 is disposed between the upper cover 30 and the lower cover 20. In other words, the resonance device 1 is formed by laminating the lower cover 20, the resonator 10, and the upper cover 30 in that order.

The resonator 10, the lower cover 20, and the upper cover 30 are joined together so as to seal the resonator 10 and form a vibration space for the resonator 10. In an exemplary aspect, each of the resonator 10, the lower cover 20, and the upper cover 30 is formed by using a Si substrate. The resonator 10, the lower cover 20, and the upper cover 30 are joined together by joining the Si substrates together. The resonator 10 and the lower cover 20 may instead be formed by using SOI substrates.

Moreover, the resonator 10 is a MEMS resonator manufactured by using MEMS technologies. The resonator 10 may instead be a crystal resonator.

The structure of the resonance device 1 will now be described in detail.

(1. Upper Cover 30)

The upper cover 30 extends along an XY plane in the shape of a plate. A shallow rectangular-parallelepiped-shaped recess 31 is formed in the back surface of the upper cover 30. The recess 31 is surrounded by a side wall 33, and constitutes a portion of the vibration space in which the resonator 10 vibrates.

(2. Lower Cover 20)

The lower cover 20 includes a rectangular-plate-shaped bottom plate 22 that extends along the XY plane and a side wall 23 that extends from a peripheral portion of the bottom plate 22 in an Z-axis direction (that is, the direction in which the lower cover 20 and the resonator 10 are laminated). According to the exemplary aspect, the lower cover 20 has a recess 21 in a surface that opposes the resonator 10. The recess 21 is defined by the front surface of the bottom plate 22 and the inner surface of the side wall 23. The recess 21 constitutes a portion of the vibration space for the resonator 10. The vibration space is airtightly sealed and maintained at vacuum by the above-described upper cover 30 and the lower cover 20. The vibration space may instead be filled with gas, such as inert gas.

Figure 3:
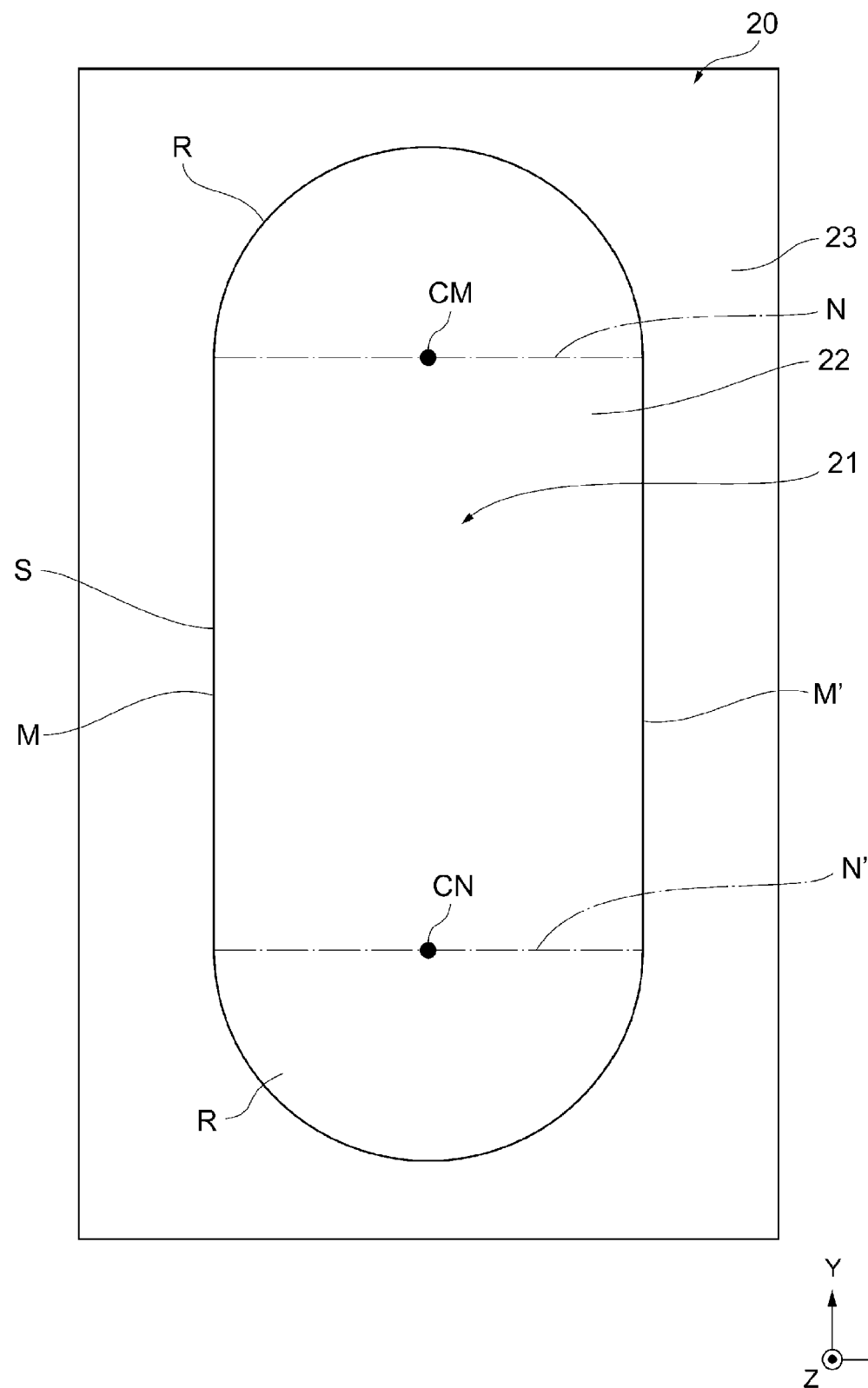
FIG. 3 is a plan view of a lower cover according to the first exemplary embodiment.

FIG. 3 is a schematic plan view illustrating the structure of the lower cover 20 according to the present embodiment. In FIG. 3, the long-side direction, short-side direction, and thickness direction of the lower cover 20 are respectively defined as a Y-axis direction, an X-axis direction, and the Z-axis direction. In a plan view of the recess 21 viewed from the resonator 10, the recess 21 is formed of a space defined by a rectangle S (hereinafter referred to simply as a "rectangle S") and spaces defined by two circular segments R (hereinafter referred to simply as "circular segments R"). The recess 21 is a single continuous space and has no partition between the rectangle S and each circular segment R.

The rectangle S has long sides M and M' extending in the Y-axis direction and short sides N and N' extending in the X-axis direction. The rectangle S has an area greater than that of a vibrating portion 120 (see FIG. 4), which will be described below, and the shape thereof is preferably similar to that of the vibrating portion 120.

The chords of the circular segments R are joined to a pair of sides of the rectangle S. The sides of the rectangle S to which the circular segments R are joined are sides (more specifically, the pair of long sides M and M' or short sides N and N') that oppose sides of a holding portion 140 (see FIG. 4), which will be described below, in the Z-axis direction, the sides of the holding portion 140 being connected to holding arms 112A and 112B. In the present embodiment, the holding portion 140 (i.e., the "frame" or "retainer") is connected to the vibrating portion 120 by the holding arms 112A and 112B at the sides of the holding portion 140 that are parallel to the X-axis direction. The sides of the rectangle S that oppose the sides of the holding portion 140 parallel to the X-axis direction in the Z-axis direction are the short sides N and N'. Therefore, the chords of the two circular segments R are arranged so as to coincide with the two short sides of the rectangle S that are parallel to the X-axis direction (dotted lines N and N' in FIG. 3).

In the exemplary aspect, the radius of circles containing the arcs of the circular segments R is greater than the radius of circles containing arcs of node forming portions 130A and 130B (see FIG. 4), which will be described below. The shape of the circular segments R is preferably similar to that of the node forming portions 130A and 130B. Moreover, the circular segments R are semicircular according to the exemplary embodiment.

In the present embodiment, the chords of the circular segments R coincide with the short sides of the rectangle S, and the circular segments R are semicircular. Therefore, the centers CM and CN of the circles containing the arcs of the circular segments R are on the sides N and N' of the rectangle S. Preferably, the centers CM and CN of the circles are located at the positions where the connecting arms 111A and 111B, which will be described below, are connected to the node forming portion 130A and 130B.

Since the recess 21 includes the circular segments R, even when the vibration of the vibrating portion 120, which will be described below, propagates through the holding arms 112A and 112B and leaks to the holding portion 140 (see FIG. 4), the vibration that has leaked can be reflected toward the centers CM and CN of the circular segments R by portions of the side wall 23 at the arcs of the circular segments R. Thus, in the resonance device 1 according to the present embodiment, the vibration isolating function of the resonator 10 can be enhanced.

(3. Resonator 10)

Figure 4:
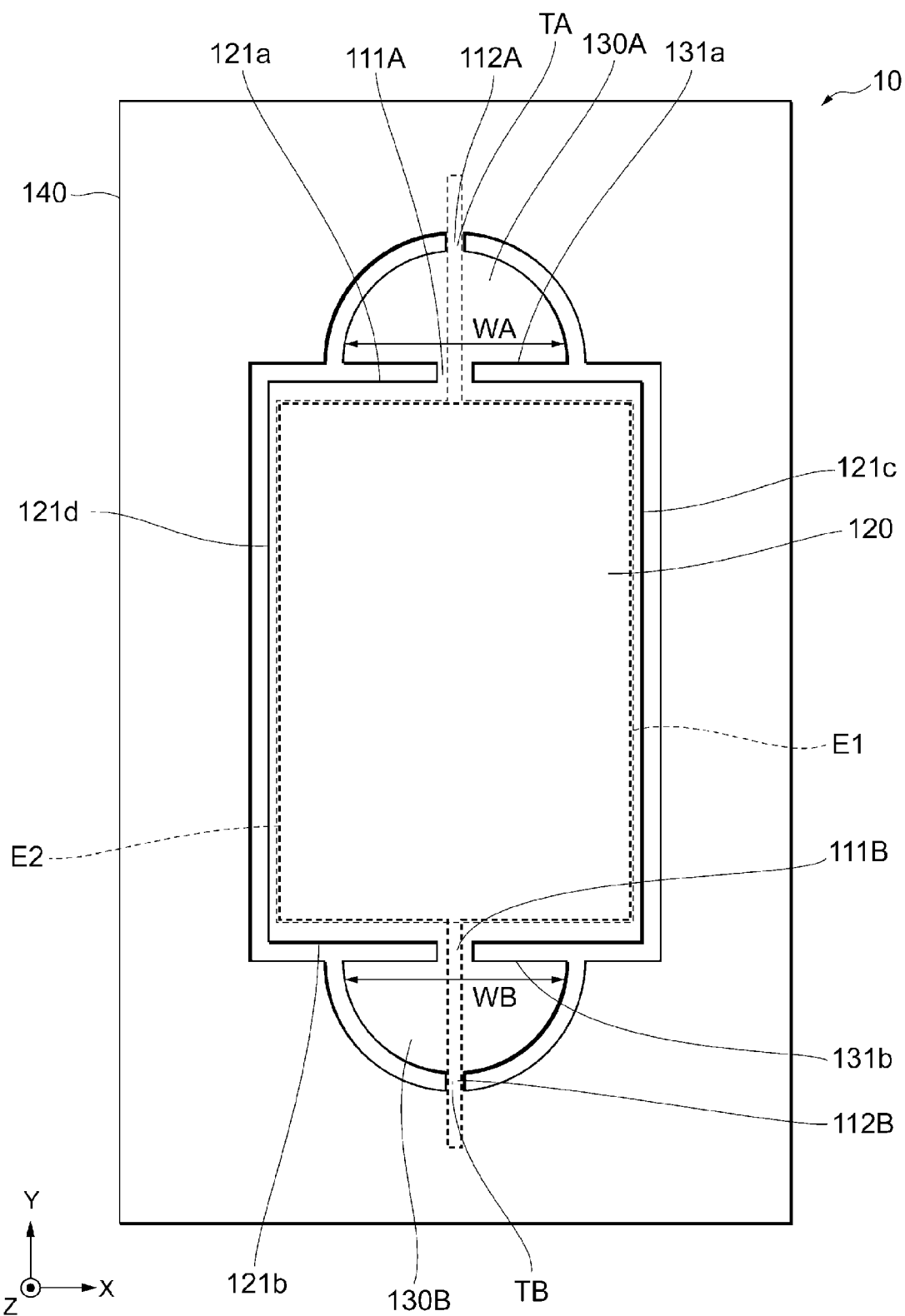
FIG. 4 is a plan view of a resonator according to the first exemplary embodiment from which an upper substrate is removed.

FIG. 4 is a schematic plan view illustrating the structure of the resonator 10 according to the present embodiment. As shown, the resonator 10 includes the vibrating portion 120 (an example of a "piezoelectric vibrating portion" or a "piezoelectric vibrator"), the holding portion 140 (an example of a "frame" or "retainer"), the node forming portions 130A and 130B (examples of "node forming portions" or "vibrational nodes" or "node generators"), connecting arms 111A and 111B (examples of "connecting arms"), and the holding arms 112A and 112B (examples of "holding arms").

(a) Vibrating Portion 120

The vibrating portion 120 (i.e., the piezoelectric vibrator) has a substantially rectangular-parallelepiped-shaped contour that extends in the shape of a plate along the XY plane in the rectangular coordinate system in FIG. 4. It is note that the term "substantially" as used herein takes into account minor variations in the shape that may occur during the manufacturing process of the vibrating portion 120. Moreover, it is noted that the shape of the vibrating portion 120 is not limited to that of a plate, and may instead be that of a quadrangular prism having a constant thickness. A rectangular-plate-shaped metal layer E1 having a length direction and a width direction is provided on the vibrating portion 120 in the region indicated by the dotted lines (the metal layer E1 formed on the vibrating portion 120 is also referred to as an "upper electrode E1". A metal layer E2 is provided below the upper electrode E1 so as to oppose the upper electrode E1 (the metal layer E2 formed on the vibrating portion 120 is also referred to as a "lower electrode E2").

Referring to FIG. 4, the vibrating portion 120 has a pair of short sides 121a and 121b extending in the X-axis direction and a pair of long sides 121c and 121d extending in the Y-axis direction. In the present embodiment, for example, the length of the short sides 121a and 121b is set to about 100 μm, and the length of the long sides 121c and 121d is set to about 150 μm.

Moreover, the upper electrode E1 and the lower electrode E2 have long sides extending in the Y-axis direction and short sides extending in the X-axis direction, and are formed on the vibrating portion 120. The upper electrode E1 is connected to a line that extends from the vibrating portion 120 to a part of the holding portion 140 that opposes the short side 121a of the vibrating portion 120 through the connecting arm 111A, the node forming portion 130A, and the holding arm 112A. The lower electrode E2 is connected to a line that extends from the vibrating portion 120 to a part of the holding portion 140 that opposes the short side 121b of the vibrating portion 120 through the connecting arm 111B, the node forming portion 130B, and the holding arm 112B.

The vibrating portion 120 and the holding portion 140 are spaced from each other by a predetermined gap. In the example illustrated in FIG. 4, the vibrating portion 120 is connected to the connecting arms 111A and 111B at the pair of short sides 121a and 121b, and is held by the holding portion 140 by being connected to the holding portion 140 through the node forming portions 130A and 130B and the holding arms 112A and 112B. The vibrating portion 120 is not connected to the holding portion 140 at the pair of long sides 121c and 121d.

(b) Holding Portion 140

The outer shape of the holding portion 140 (i.e., the frame or retainer) is the shape of, for example, a rectangular frame that extends along the XY plane. The inner shape of the holding portion 140 is such that the holding portion 140 surrounds the vibrating portion 120 and the node forming portions 130A and 130B along the XY plane. In the present embodiment, the holding portion 140 has the shape of a frame obtained by cutting a rectangular plate along the contours of the vibrating portion 120 and the node forming portions 130A and 130B. A space (gap) of a predetermined size is formed between the holding portion 140 and each of the vibrating portion 120 and the node forming portions 130A and 130B.

The shape of the holding portion 140 is not limited to a frame shape as long as the holding portion 140 is provided in at least a part of a region around the vibrating portion 120.

(c) Node Forming Portions 130A and 130B

The node forming portion 130A is provided between the short side 121a of the vibrating portion 120 and a part of the holding portion 140 that opposes the short side 121a. The node forming portion 130A includes a connection side 131a that opposes the short side 121a of the vibrating portion 120, and is connected to the connecting arm 111A at the connection side 131a. The connection side 131a extends substantially parallel to the short side 121a with a predetermined gap therebetween.

The node forming portion 130A is shaped so that the width WA thereof in the X-axis direction (example of a second direction) decreases with increasing distance from the connecting arm 111A toward the holding arm 112A. Thus, as shown, the node forming portion 130A is axisymmetric about the perpendicular bisector of the connection side 131a. The node forming portion 130A has a maximum length in the X-axis direction at a position closer to the connecting arm 111A than the center thereof in the Y-axis direction (example of a first direction) is. In the present embodiment, the width WA of the node forming portion 130A is at a maximum at the connection side 131a, decreases with increasing distance from the connecting arm 111A toward the holding arm 112A, and is at a minimum on the axis. It is not necessary that the width WA decrease continuously. For example, the width WA may decrease stepwise, or temporarily increase as long as the width WA gradually decreases overall according to alternative aspects. For example, the node forming portion 130A may have a shape similar to that of the circular segments R of the lower cover 20. Also, it is not necessary that the node forming portion 130A have a smooth periphery, and may instead have an irregular periphery. The node forming portion 130A is connected to the holding arm 112A at the position where the width WA thereof is at a minimum (hereinafter referred to as a "vertex TA").

The length of the connection side 131a is greater than the width of the connecting arm 111A in the X-axis direction. The length of the connection side 131a is preferably less than the width of the vibrating portion 120 in the X-axis direction. More preferably, the length of the connection side 131a is about 60 percent of the width of the vibrating portion 120 in the X-axis direction.

The structure of the node forming portion 130B is similar to that of the node forming portion 130A and will not be repeated herein.

In the present embodiment, the node forming portions 130A and 130B have the shape of semicircles having diameters defined by the connection sides 131a and 131b and having a radius of about 30 μm in the exemplary aspect. In this case, the centers of circles containing the arcs of the node forming portions 130A and 130B are at, for example, the midpoints of the connection sides 131a and 131b. The centers of the circles containing the arcs of the node forming portions 130A and 130B may be the positions at which the vibrating portion 120 is connected to the connecting arms 111A and 111B. The connection sides 131a and 131b do not need to be linear, and may instead be arc shaped. In such as case, the connecting arms 111A and 111B are connected to the vertices of the connection sides 131a and 131b. In addition, in this case, the center of the circle containing each arc-shaped connection side 131a (131b) may be closer to either the connecting arm 111A (111B) or the holding arm 112A (112B).

(d) Connecting Arms 111A and 111B

The connecting arm 111A is substantially rectangular. The connecting arm 111A is connected to a central portion of the short side 121a of the vibrating portion 120 at one end thereof, and extends toward the node forming portion 130A in a direction perpendicular to the short side 121a. The other end of the connecting arm 111A is connected to the connection side 131a of the node forming portion 130A. In the present embodiment, the width of the connecting arm 111A in the X-axis direction is about 10 μm.

The structure of the connecting arm 111B is similar to that of the connecting arm 111A and will not be repeated herein.

(e) Holding Arms 112A and 112B

The holding arm 112A is substantially rectangular. Moreover, the holding arm 112A is connected to the vertex TA of the node forming portion 130A at one end thereof, and extends in the Y-axis direction toward a part of the holding portion 140 that opposes the node forming portion 130A. The other end of the holding arm 112A is connected to the part of the holding portion 140 that opposes the node forming portion 130A. The width of the holding arm 112A is preferably less than or equal to the width of the connecting arm 111A. In the present embodiment, the width of the holding arm 112A in the X-axis direction is less than that of the connecting arm 111A, and is about 5 for example. When the width of the holding arm 112A is less than that of the connecting arm 111A, vibration does not easily propagate from the node forming portion 130A to the holding portion 140.

The structure of the holding arm 112B is similar to that of the holding arm 112A and will not be repeated herein.

(4. Laminated Structure)

The laminated structure (sectional structure) of the resonance device 1 will now be described with reference to FIGS. 5(A) and 5(B). FIG. 5(A) is a sectional view of FIG. 1 taken along line A-A'. FIG. 5(B) is a sectional view of FIG. 1 taken along line B-B'.

As illustrated in FIGS. 5(A) and 5(B), in the resonance device 1 according to the present embodiment, the side wall 23 of the lower cover 20 and the holding portion 140 of the resonator 10 are joined together, and the holding portion 140 of the resonator 10 and the side wall 33 of the upper cover 30 are joined together. Thus, the resonator 10 is held between the lower cover 20 and the upper cover 30, and the vibration space in which the vibrating portion 120 vibrates is formed between the lower cover 20 and the upper cover 30.

The bottom plate 22 and the side wall 23 of the lower cover 20 are integrally formed by using silicon (Si). A silicon oxide (for example, $SiO_2$) film F1 is formed on the top surface of the side wall 23, and the lower cover 20 is joined to the holding portion 140 of the resonator 10 by this silicon oxide film F1. The thickness of the lower cover 20 in the Z-axis direction is, for example, 150 μm, and the depth of the recess 21 is, for example, 50 μm.

The upper cover 30 is formed of a silicon (Si) wafer having a predetermined thickness. As illustrated in FIG. 5, a peripheral portion (side wall 33) of the upper cover 30 is joined to the holding portion 140 of the resonator 10. A joining layer H is formed between the peripheral portion of the upper cover 30 and the holding portion 140. The upper cover 30 is joined to the holding portion 140 by the joining layer H. The joining layer H is formed of, for example, a gold (Au) film and a tin (Sn) film.

The holding portion 140, the vibrating portion 120, the node forming portions 130A and 130B, the connecting arms 111A and 111B, and the holding arms 112A and 112B of the resonator 10 are formed in the same process. More specifically, first, the metal layer E2 is formed on a silicon (Si) layer F2. Then, a piezoelectric thin film F3 is formed on the metal layer E2 so as to cover the metal layer E2, and the metal layer E1 is formed on the piezoelectric thin film F3. Then, the piezoelectric thin film F3 is additionally formed on the metal layer E1.

The Si layer F2 is made of, for example, a degenerate n-type Si semiconductor having a thickness of about 30 and contains phosphorus (P), arsenic (As), and antimony (Sb) as n-type dopants. The resistance of the degenerate Si used to form the Si layer F2 is preferably greater than or equal to 0.5 mΩ·cm and less than or equal to 0.9 mΩ·cm. The resistance of the degenerate Si used in the present embodiment is, for example, 0.63 mΩ·cm. A silicon oxide layer (for example, a $SiO_2$ layer) may be formed on the bottom surface of the Si layer F2. Thus, the temperature characteristics of the vibrating portion 120 can be improved.

The metal layers E2 and E1 are made of, for example, molybdenum (Mo) or aluminum (Al), and have a thickness of, for example, about 0.1 μm. In the case where the Si layer F2 is made of degenerate Si, the Si layer F2 may be used as the lower electrode instead of the metal layer E2.

The metal layers E2 and E1 are formed in desired shapes by, for example, etching. The metal layer E2 is formed so as to function as a lower electrode on the vibrating portion 120. The metal layer E2 is formed so as to function as a wire for connecting the lower electrode to an alternating-current power supply, which is disposed outside the resonator 10, on the node forming portion 130B, the connecting arm 111B, the holding arm 112B, and the holding portion 140.

The metal layer E1 is formed so as to function as the upper electrode E1 on, for example, the vibrating portion 120. The metal layer E1 is formed so as to function as, for example, a wire for connecting the upper electrode E1 to the alternating-current power supply, which is disposed outside the resonator 10, on the node forming portion 130A, the connecting arm 111A, the holding arm 112A, and the holding portion 140.

The alternating-current power supply may be connected to the lower wire or the upper wire by forming an electrode on the outer surface of the upper cover 30 so that the electrode connects the alternating-current power supply to the lower wire or the upper wire, or by forming a via in the upper cover 30 and filling the via with a conductive material to form a wire that connects the alternating-current power supply to the lower wire or the upper wire.

The piezoelectric thin film F3 is a thin film made of a piezoelectric material that converts a voltage applied thereto into vibration, and may have, for example, a nitride, such as aluminum nitride (AlN), or an oxide as a main component thereof. More specifically, the piezoelectric thin film F3 may be made of scandium aluminum nitride (ScAlN). ScAlN is obtained by partially replacing aluminum contained in aluminum nitride with scandium. The piezoelectric thin film F3 has a thickness of, for example, 1 μm.

The piezoelectric thin film F3 expands and contracts in an in-plane direction along the XY plane in response to an electric field applied to the piezoelectric thin film F3 by the metal layers E2 and E1. The expansion and contraction of the piezoelectric thin film F3 generate contour vibration of the vibrating portion 120 in the X-axis direction. The vibration of the vibrating portion 120 propagates to the node forming portions 130A and 130B through the connecting arms 111A and 111B.

FIGS. 6(A) to 6(C) are schematic diagrams illustrating distributions of displacements of the resonator 10 according to the present embodiment due to the vibration along the X-axis, Y-axis, and Z-axis, respectively. In each of the diagrams shown in FIG. 6, the resonator 10 is colored with a gradation of white to dark gray. The regions in light gray, which is substantially the midpoint of the gradation range, indicate regions in which the displacement is substantially zero. The regions darker than light gray indicate regions where the direction of displacement is positive along each axis, and the regions lighter (closer to white) than light gray indicate regions where the direction of displacement is negative along each axis.

FIG. 6(A) shows the displacement in the X-axis direction. As illustrated in FIG. 6(A), the direction of displacement of the vibrating portion 120 along the X-axis is reversed at the center line CY of the vibrating portion 120 that extends in the Y-axis direction. The direction of displacement of each of the node forming portions 130A and 130B along the X-axis is also reversed at the center line CY. The directions of displacements of parts of the node forming portions 130A and 130B around the vertices thereof are opposite to the directions of displacements of parts of the vibrating portion 120 that oppose the connection sides 131a and 131b. Accordingly, the node forming portions 130A and 130B have parts at which the displacement is small in regions adjacent to the parts at which the displacement is large.

As a result, displacements in the X-axis direction of parts of the node forming portions 130A and 130B around the vertices thereof are reduced due to the regions adjacent to the regions around the vertices and in which the displacement is small. The positions where the displacements are reduced to a minimum are referred to as nodes. In the present embodiment, the nodes of the vibration in the X-axis direction are provided on the center line CY.

FIG. 6(B) shows the displacement in the Y-axis direction. As illustrated in FIG. 6(B), the direction of displacement of the vibrating portion 120 along the Y-axis is reversed at the center line CX of the vibrating portion 120 that extends in the X-axis direction. The displacement of each of the node forming portions 130A and 130B in the Y-axis direction is axisymmetric about the center line CY. The directions of displacements along the Y-axis of end parts of the node forming portions 130A and 130B in the X-axis direction are opposite to the directions of displacements of central parts of the node forming portions 130A and 130B in the X-axis direction. Accordingly, the node forming portions 130A and 130B have parts at which the displacement is small in regions adjacent to the end parts and the central parts at which the displacement is large. When the vibrating portion 120 is divided into two halves along the center line CX, the direction of displacement of the part of the vibrating portion 120 near the node forming portion 130A is opposite to the direction of displacement of the central part of the node forming portion 130A. Also, the direction of displacement of the part of the vibrating portion 120 near the node forming portion 130B is opposite to the direction of displacement of the central part of the node forming portion 130B.

As a result, the vibration generated at the end parts and the central parts of the node forming portions 130A and 130B is reduced in the regions that are adjacent to the end parts and the central parts and in which the displacement is small. Therefore, the displacement in the Y-axis direction is small in the regions around the vertices of the node forming portions 130A and 130B. Thus, the node forming portions 130A and 130B have nodes of the vibration in the Y-axis direction at the vertices thereof. In the present embodiment, the nodes of the vibration in the Y-axis direction are provided on the center line CY.

FIG. 6(C) shows the displacement in the Z-axis direction. As illustrated in FIG. 6(C), the vibrating portion 120 also vibrates in the Z-axis direction. As illustrated in FIG. 5, the resonator 10 is formed by laminating materials having different acoustic velocities. Therefore, the layers included in the resonator 10 have different elasticities. As a result, the in-plane vibration of the vibrating portion 120 causes vibration of the vibrating portion 120 in the Z-axis direction.

The central part of the vibrating portion 120 is displaced in the positive Z-axis direction, and the four corners of the vibrating portion 120 are displaced in the negative Z-axis direction.

The displacement of each of the node forming portions 130A and 130B in the Z-axis direction is axisymmetric about the center line CY. The directions of displacements along the Z-axis of end parts of the node forming portions 130A and 130B are opposite to the directions of displacements of central parts of the node forming portions 130A and 130B. Accordingly, the node forming portions 130A and 130B have parts at which the displacement is small in regions adjacent to the end parts and the central parts at which the displacement is large.

As a result, the displacements of the end parts and the central parts of the node forming portions 130A and 130B are reduced in the regions that are adjacent to the end parts and the central parts and in which the displacement is small, and therefore the vibration in the Z-axis direction is cancelled at the vertices of the node forming portions 130A and 130B. Thus, the node forming portions 130A and 130B have nodes of the vibration in the Z-axis direction at the vertices thereof. In the present embodiment, the nodes of the vibration in the Z-axis direction are provided on the center line CY.

Thus, the node forming portions 130A and 130B have parts at which the displacement is small in each of the X-axis, Y-axis, and Z-axis directions in regions adjacent to the parts at which the displacement is at a maximum along the outer peripheries thereof. In the resonator 10 according to the present embodiment, the node forming portions 130A and 130B are formed so that the width thereof is greater than that of the connecting arms 111A and 111B at the connection sides 131a and 131b, and so that the width thereof continuously decreases with increasing distance from the connection sides 131a and 131b toward the holding arms 112A and 112B. Accordingly, the node forming portions 130A and 130B have parts at which the displacement is large at certain locations in the regions in which the width decreases (arc regions), and also have parts at which the displacement is small in regions adjacent to the parts at which the displacement is large.

As described above, the width of the node forming portions 130A and 130B gradually decreases with increasing distance from the connecting arms 111A and 111B toward the holding arms 112A and 112B. Therefore, even when the manner in which the vibration propagates from the vibrating portion 120 changes, the node forming portions 130A and 130B have parts at which the displacement is small in regions adjacent to the parts at which the displacement is large. Thus, the node forming portions 130A and 130B are capable of adjusting displacement parts in response to the vibration that leaks from the vibrating portion 120, and nodes can be formed on the node forming portions 130A and 130B. When the node forming portions 130A and 130B are connected to the holding arms 112A and 112B at the nodes, propagation of the vibration from the vibrating portion 120 to the holding portion 140 can be suppressed.

In the present embodiment, the holding arms 112A and 112B are formed at the vertices of the node forming portions 130A and 130B, that is, at the nodes. As a result, the vibration generated at the vibrating portion 120 is canceled at the holding arms 112A and 112B, and does not propagate to the holding portion 140. Thus, the anchor loss of the resonator 10 can be reduced, and the Q factor can be increased.

Figure 7:
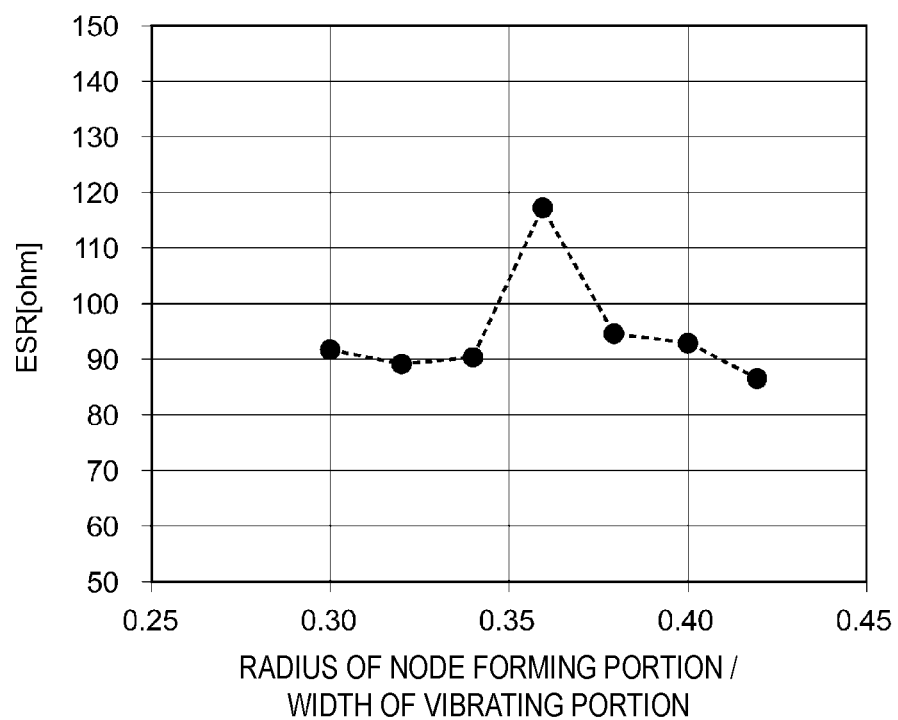
FIG. 7 is a graph showing the relationship between the ratio of the radius of node forming portions to the width of a vibrating portion and the equivalent series resistance according to the first exemplary embodiment.

FIG. 7 is a graph showing the relationship between the radius of the node forming portions 130A and 130B relative to the width of the vibrating portion 120 and the equivalent series resistance (ESR). The vertical axis represents the value of ESR. The horizontal axis represents the ratio of the radius of the node forming portions 130A and 130B to the length of the short side 121a of the vibrating portion 120. Referring to FIG. 7, a weak alternating electric field having any frequency was applied to an input/output terminal of the resonance device 1, and the impedance at each frequency was measured by using an impedance analyzer. Among the measured impedances, the minimum impedance was determined as the ESR. The graph of FIG. 7 shows that the Q factor is maximized except for the case in which the ratio of the radius of the node forming portions 130A and 130B to the length of the short side 121a is about 0.35.

Second Embodiment

In the second and following embodiments, description of matters that are the same as those in the first embodiment will be omitted, and only differences will be described. In particular, similar effects obtained by similar structures will not be described in each embodiment.

Figure 8:
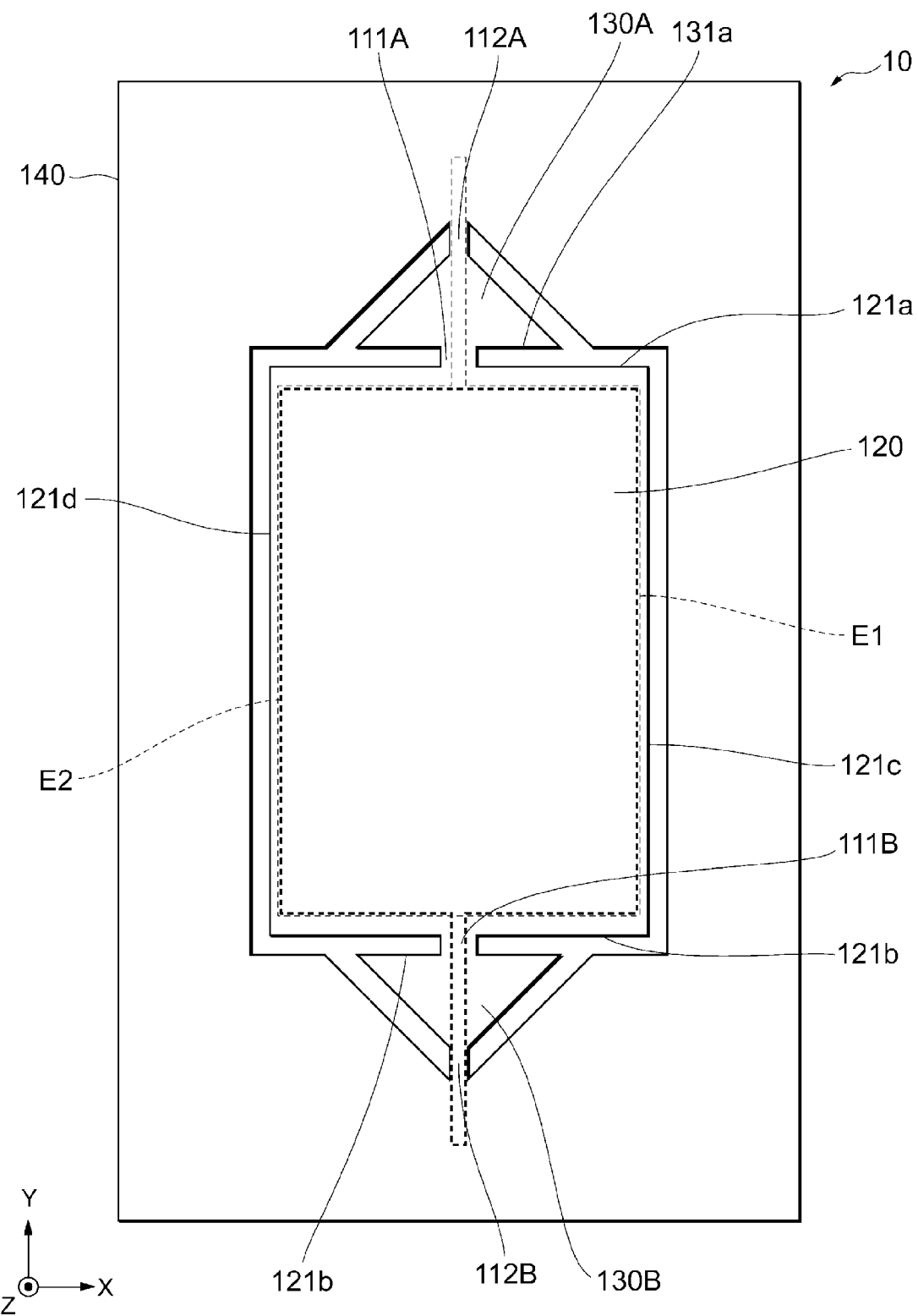
FIG. 8 is a plan view corresponding to FIG. 4 and illustrating a resonator according to a second exemplary embodiment from which an upper substrate is removed.

FIG. 8 illustrates an example of a plan view of a resonator 10 according to the second embodiment. The differences between the detailed structure of a resonance device 1 according to the present embodiment and that of the first embodiment will now be mainly described.

In the present embodiment, the node forming portions 130A and 130B have the shape of isosceles triangles having the connection sides 131a and 131b at the bases thereof. Other structures of the node forming portions 130A and 130B are similar to those in the first embodiment. Other structures and effects are similar to those in the first embodiment.

Third Embodiment

Figure 9:
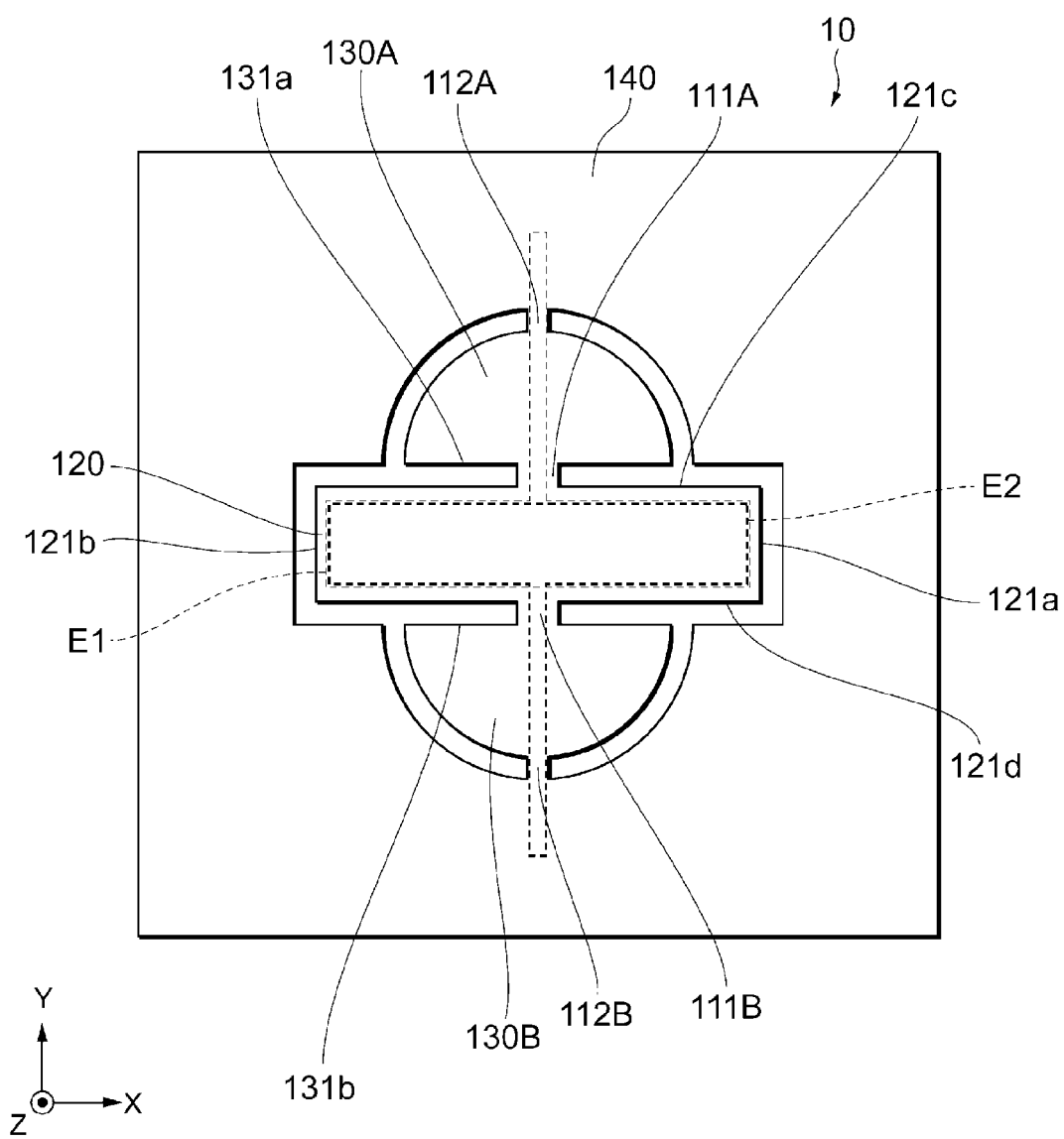
FIG. 9 is a plan view corresponding to FIG. 4 and illustrating a resonator according to a third exemplary embodiment from which an upper substrate is removed.

FIG. 9 illustrates an example of a plan view of a resonator 10 according to the present embodiment. The differences between the detailed structure of a resonance device 1 according to the present embodiment and that of the first embodiment will now be mainly described.

(3-1) Vibrating Portion 120

In the present embodiment, the vibrating portion 120 has a pair of long sides 121c and 121d extending in the X-axis direction and a pair of short sides 121a and 121b extending in the Y-axis direction. The upper electrode E1 and the lower electrode E2 have short sides extending in the Y-axis direction and long sides extending in the X-axis direction. The vibrating portion 120 of the present embodiment causes in-plane vibration in the longitudinal direction. Other structures of the vibrating portion 120 are similar to those in the first embodiment.

(3-2) Connecting Arms 111A and 111B

In the present embodiment, the connecting arm 111A is connected to a central portion of the long side 121c of the vibrating portion 120 at one end thereof, and extends toward the node forming portion 130A. The connecting arm 111B is connected to a central portion of the long side 121d of the vibrating portion 120 at one end thereof, and extends toward the node forming portion 130B. Other structures of the connecting arms 111A and 111B are similar to those in the first embodiment.

Other structures and effects are similar to those in the first embodiment.

Fourth Embodiment

Figure 10:
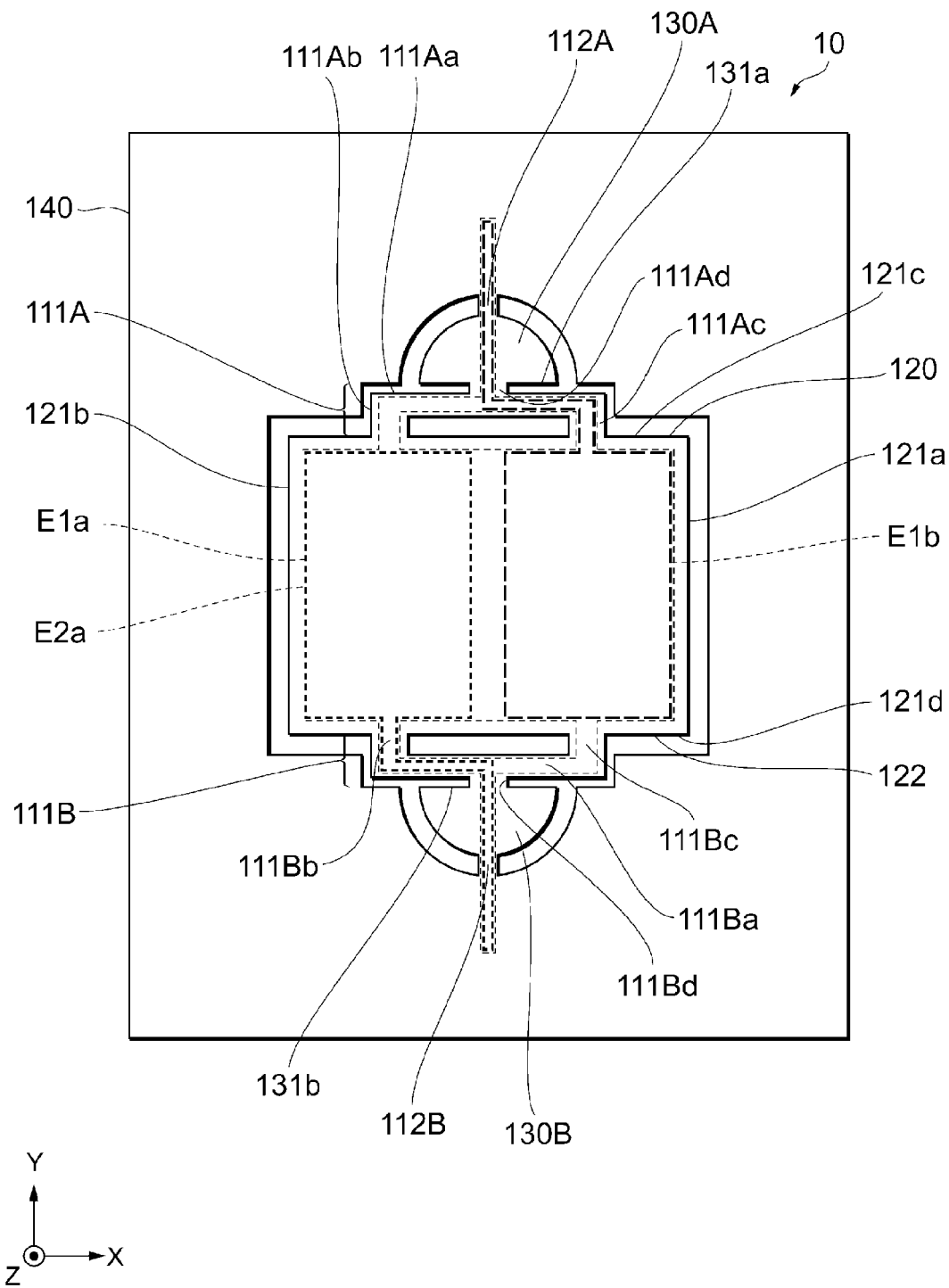
FIG. 10 is a plan view corresponding to FIG. 4 and illustrating a resonator according to a fourth exemplary embodiment from which an upper substrate is removed.

FIG. 10 illustrates an example of a plan view of a resonator 10 according to the present embodiment. The differences between the detailed structure of a resonance device 1 according to the present embodiment and that of the first embodiment will now be mainly described.

(4-1) Vibrating Portion 120

In the present embodiment, two rectangular-plate-shaped upper electrodes E1a and E1b having a length direction and a width direction are provided on the vibrating portion 120. In addition, a lower electrode E2a is provided below the upper electrodes E1a and E1b so as to oppose the upper electrodes E1a and E1b. In FIG. 10, the vibrating portion 120 has a pair of long sides 121c and 121d extending in the X-axis direction and a pair of short sides 121a and 121b extending in the Y-axis direction.

The upper electrodes E1a and E1b have long sides extending in the Y-axis direction and short sides extending in the X-axis direction, and are formed on the vibrating portion 120.

The upper electrode E1a is connected to a line that extends from the vibrating portion 120 to a side of the holding portion 140 that opposes the long side 121d through the connecting arm 111B, the node forming portion 130B, and the holding arm 112B. The upper electrode E1b is connected to a line that extends from the vibrating portion 120 to a part of the holding portion 140 that opposes the long side 121c through the connecting arm 111A, the node forming portion 130A, and the holding arm 112A.

The lower electrode E2a has long sides extending in the X-axis direction and short sides extending in the Y-axis direction, and is formed on the vibrating portion 120. The lower electrode E2a is connected to lines that extend from the vibrating portion 120 to a part of the holding portion 140 that opposes the long side 121c and a part of the holding portion 140 that opposes the long side 121d through the connecting arms 111A and 111B, the node forming portions 130A and 130B, and the holding arms 112A and 112B.

Other structures of the vibrating portion 120 are similar to those in the first embodiment.

(4-2) Connecting Arms 111A and 111B

In the present embodiment, the connecting arm 111A includes four arms 111Aa, 111Ab, 111Ac, and 111Ad. The arm 111Aa is an example of a first arm. The arms 111Ab and 111Ac are examples of second arms. The arm 111Ad is an example of a third arm. The arm 111Aa extends parallel to the X-axis direction along the upper electrodes E1a and E1b in the space between the vibrating portion 120 and the node forming portion 130A so as to oppose the long side 121c of the vibrating portion 120.

The arm 111Ad extends parallel to the Y-axis direction. The arm 111Ad is connected to the node forming portion 130A in a vicinity of a central part of the connection side 131a of the node forming portion 130A, and connects the node forming portion 130A to the arm 111Aa.

The arm 111Ab extends parallel to the Y-axis direction. The bottom end of the arm 111Ab is connected to the long side 121c of the vibrating portion 120 in a vicinity of a central part of the upper short side of the upper electrode E1a. The top end of the arm 111Ab is connected to one end of the arm 111Aa.

The arm 111Ac extends parallel to the Y-axis direction. The bottom end of the arm 111Ac is connected to the long side 121c of the vibrating portion 120 in a vicinity of a central part of the upper short side of the upper electrode E1b. The top end of the arm 111Ac is connected to the other end of the arm 111Aa. Other structures of the connecting arm 111A are similar to those in the first embodiment.

The structure of the connecting arm 111B is similar to that of the connecting arm 111A.

In the present embodiment, the node forming portions 130A and 130B have a function of a buffer for torsional displacements of the arms 111Ad and 111Bd in addition to the functions described in the first embodiment. As a result, the displacements of the holding arms 112A and 112B are reduced, and the anchor loss can be reduced.

Other structures and effects are similar to those in the first embodiment.

Fifth Embodiment

Figure 11:
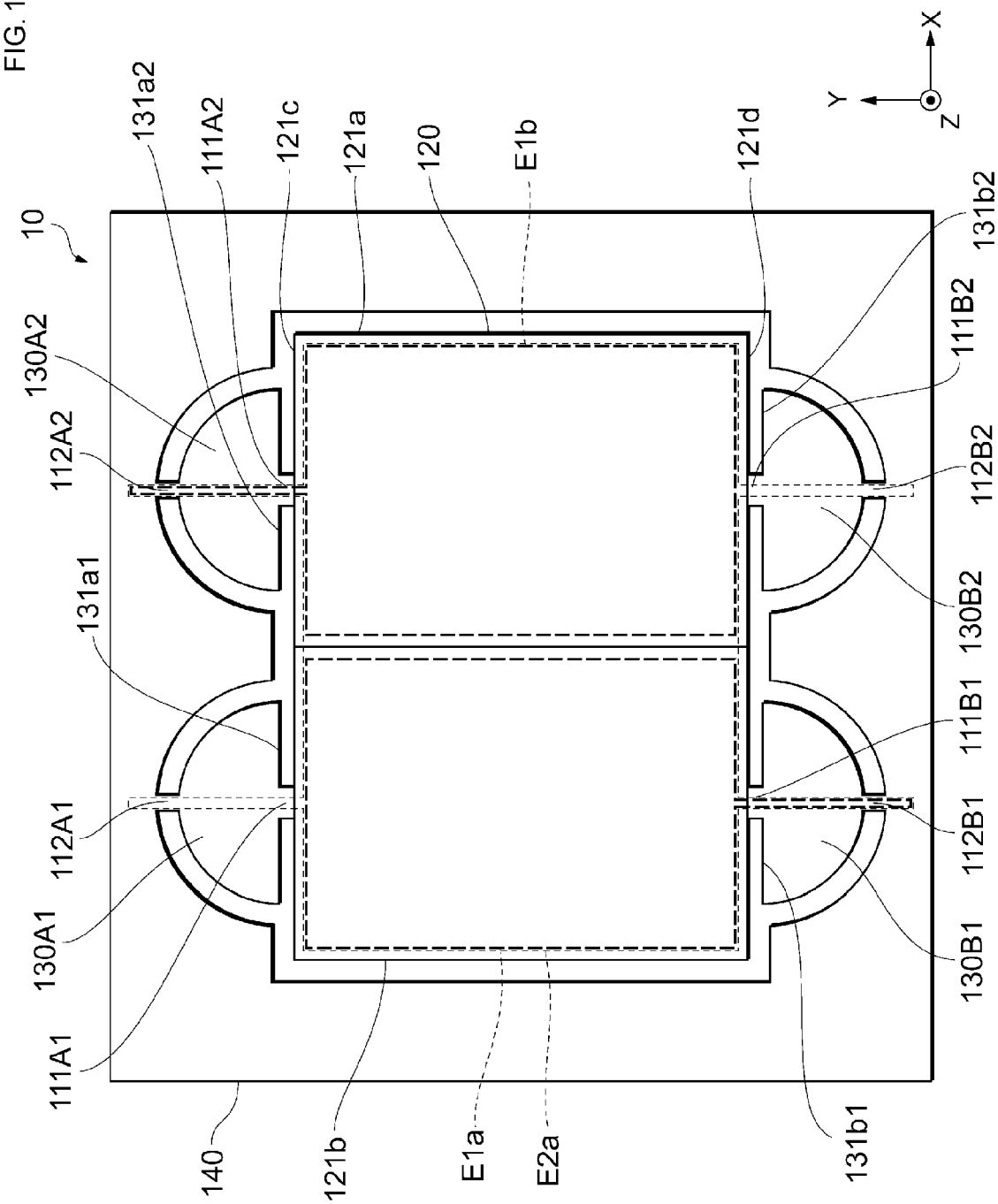
FIG. 11 is a plan view corresponding to FIG. 4 and illustrating a resonator according to a fifth exemplary embodiment from which an upper substrate is removed.

FIG. 11 illustrates an example of a plan view of a resonator 10 according to the present embodiment. The differences between the detailed structure of a resonance device 1 according to the present embodiment and that of the first embodiment will now be mainly described.

(5-1) Lower Cover 20

In the present embodiment, the recess 21 in the lower cover 20 has two circular segments R on each of the pair of long sides of the rectangle S. Other structures of the lower cover are similar to those in the first embodiment.

(5-2) Resonator 10

In the present embodiment, the resonator 10 includes node forming portions 130A1, 130A2, 130B1, and 130B2, connecting arms 111A1, 111A2, 111B1, and 111B2, and holding arms 112A1, 112A2, 112B1, and 112B2 as components corresponding to the node forming portions 130A and 130B, the connecting arms 111A and 111B, and the holding arms 112A and 112B according to the first embodiment.

(5-2-1) Vibrating Portion 120

In the present embodiment, two rectangular-plate-shaped upper electrodes E1a and E1b having a length direction and a width direction are provided on the vibrating portion 120. A lower electrode E2a is provided below the upper electrodes E1a and E1b so as to oppose the upper electrodes E1a and E1b. In FIG. 11, the vibrating portion 120 has a pair of long sides 121c and 121d extending in the X-axis direction and a pair of short sides 121a and 121b extending in the Y-axis direction.

The upper electrodes E1a and E1b have long sides extending in the Y-axis direction and short sides extending in the X-axis direction, and are formed on the vibrating portion 120.

The upper electrode E1a is connected to a line that extends from the vibrating portion 120 to a side of the holding portion 140 that opposes the long side 121d through the connecting arm 111B1, the node forming portion 130B1, and the holding arm 112B1. The upper electrode E1b is connected to a line that extends from the vibrating portion 120 to a part of the holding portion 140 that opposes the long side 121c through the connecting arm 111A2, the node forming portion 130A2, and the holding arm 112A2.

The lower electrode E2a has long sides extending in the X-axis direction and short sides extending in the Y-axis direction, and is formed on the vibrating portion 120. The lower electrode E2a is connected to lines that extend from the vibrating portion 120 to a part of the holding portion 140 that opposes the long side 121c and a part of the holding portion 140 that opposes the long side 121d through the connecting arms 111A1, 111A2, 111B1, and 111B2, the node forming portions 130A1, 130A2, 130B1, and 130B2, and the holding arms 112A1, 112A2, 112B1, and 112B2. Other structures of the vibrating portion 120 are similar to those in the first embodiment.

(5-2-2) Node Forming Portions 130A1, 130A2, 130B1, and 130B2

The node forming portions 130A1 and 130A2 respectively oppose the upper short sides of the upper electrodes E1a and E1b.

The node forming portions 130A1 and 130A2 are respectively connected to the connecting arms 111A1 and 111A2 at connection sides 131a1 and 131a2 of the node forming portions 130A1 and 130A2 that oppose the long side 121c of the vibrating portion 120. The node forming portions 130A1 and 130A2 are also respectively connected to the holding arms 112A1 and 112A2 at vertices at which the width WA thereof in the X-axis direction is at a minimum.

The structures of the node forming portions 130B1 and 130B2 are similar to those of the node forming portions 130A1 and 130A2.

(5-2-3) Connecting Arms 111A1, 111A2, 111B1, and 111B2

In the present embodiment, the connecting arms 111A1 and 111A2 extend in the Y-axis direction.

Each of the connecting arms 111A1 and 111A2 is connected to the long side 121c of the vibrating portion 120 at one end thereof, and extends toward a corresponding one of the node forming portions 130A1 and 130A2. The connecting arm 111A1 is connected to the long side 121c in a vicinity of a central part of the upper short side of the upper electrode E1a. The connecting arm 111A2 is connected to the long side 121c in a vicinity of a central part of the upper short side of the upper electrode E1b. The other end of each of the connecting arms 111A1 and 111A2 is connected to a corresponding one of the connection sides 131a1 and 131b1 of the node forming portions 130A1 and 130A2 in a direction substantially perpendicular thereto. Other structures of the connecting arms 111A1 and 111A2 are similar to those in the first embodiment.

The structures of the connecting arms 111B1 and 111B2 are similar to those of the connecting arms 111A1 and 111A2.

(5-2-4) Holding Arms 112A1, 112A2, 112B1, and 112B2

In the present embodiment, the holding arms 112A1 and 112A2 extend in the Y-axis direction.

Each of the holding arms 112A1 and 112A2 is connected to the vertex of a corresponding one of the node forming portions 130A1 and 130A2 at one end thereof, and extends toward a part of the holding portion 140 that opposes the corresponding one of the node forming portions 130A1 and 130A2. The other end of each of the holding arms 112A1 and 112A2 is connected to the part of the holding portion 140 that opposes the corresponding one of the node forming portions 130A1 and 130A2. Other structures of the holding arms 112A1 and 112A2 are similar to those in the first embodiment.

The structures of the holding arms 112B1 and 112B2 are similar to those of the holding arms 112A1 and 112A2.

Other structures and effects are similar to those in the first embodiment.

Sixth Embodiment

Figure 12:
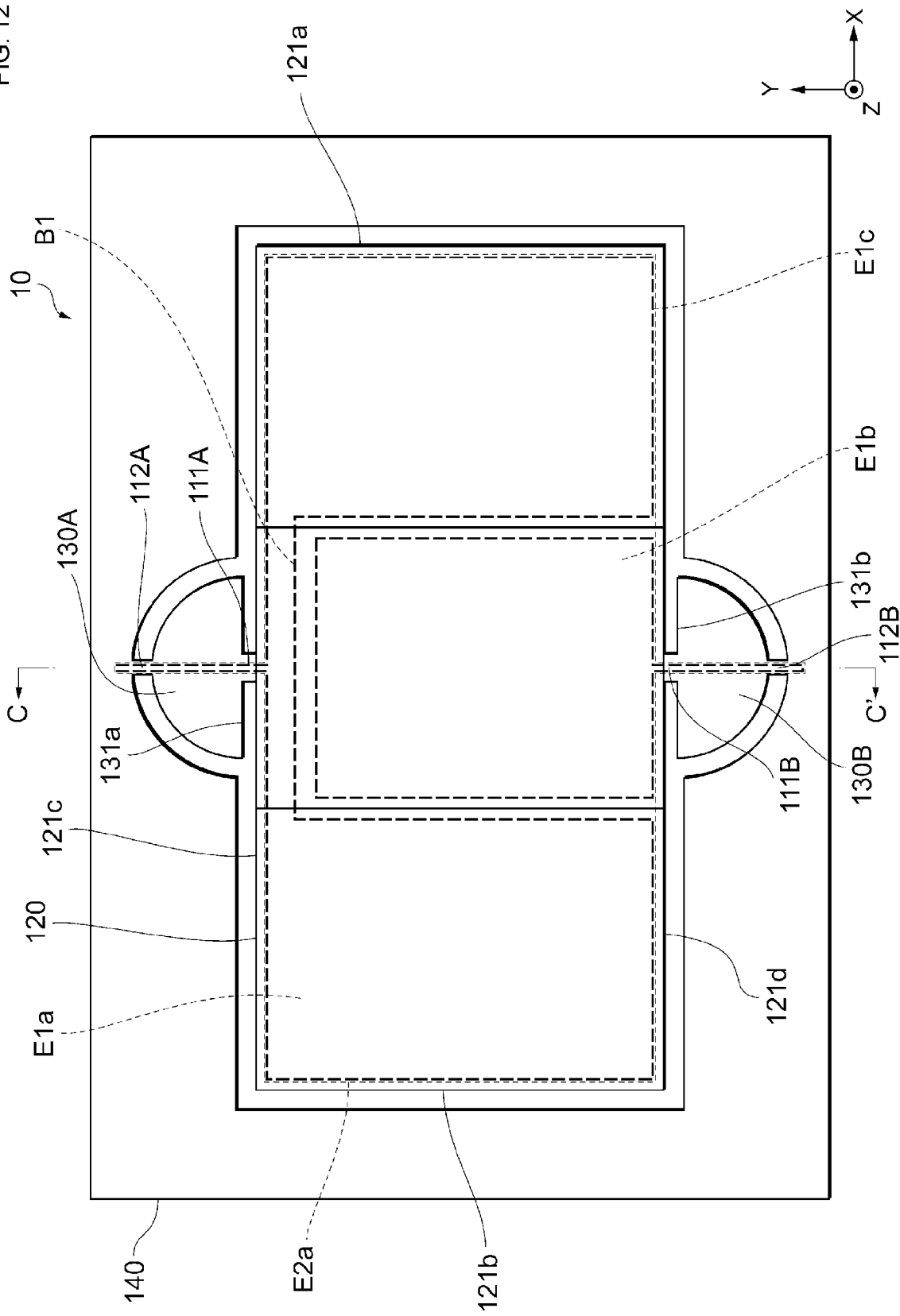
FIG. 12 is a plan view corresponding to FIG. 4 and illustrating a resonator according to a sixth exemplary embodiment from which an upper substrate is removed.

FIG. 12 illustrates an example of a plan view of a resonator 10 according to the present embodiment. The differences between the detailed structure of a resonance device 1 according to the present embodiment and that of the first embodiment will now be mainly described.

(6-1) Lower Cover 20

In the present embodiment, the recess 21 in the lower cover 20 is formed so that the circular segments R thereof are connected to a pair of long sides of the rectangle S. Other structures of the lower cover are similar to those in the first embodiment.

(6-2) Resonator 10

(6-2-1) Vibrating Portion 120

In the present embodiment, three rectangular-plate-shaped upper electrodes E1a, E1b, and E1c having a length direction and a width direction are provided on the vibrating portion 120. A lower electrode E2a is provided below the upper electrodes E1a, E1b, and E1c so as to oppose the upper electrodes E1a, E1b, and E1c. Referring to FIG. 12, the vibrating portion 120 has a pair of short sides 121a and 121b extending in the Y-axis direction and a pair of long sides 121c and 121d extending in the X-axis direction.

The upper electrodes E1a, E1b, and E1c have long sides extending in the Y-axis direction and short sides extending in the X-axis direction, and are formed on the vibrating portion 120.

The upper electrodes E1a and E1c are electrically connected to each other by a busbar B1. The busbar B1 is provided on an end part of the vibrating portion 120 near the node forming portion 130A so as to oppose the upper electrode E1b. The busbar B1 is connected to a line that extends to a side of the holding portion 140 opposite to the long side 121c of the vibrating portion 120 through the connecting arm 111A, the node forming portion 130A, and the holding arm 112A.

The upper electrode E1b is connected to a line that extends to a part of the holding portion 140 that opposes the long side 121d of the vibrating portion 120 through the connecting arm 111B, the node forming portion 130B, and the holding arm 112B.

The lower electrode E2a has long sides extending in the X-axis direction and short sides extending in the Y-axis direction, and is formed on the vibrating portion 120. The lower electrode E2a is connected to lines that extend from the vibrating portion 120 to a side of the holding portion 140 that opposes the long side 121c and a side of the holding portion 140 that opposes the long side 121d through the connecting arms 111A and 111B, the node forming portions 130A and 130B, and the holding arms 112A and 112B.

Other structures of the vibrating portion 120 are similar to those in the first embodiment.

(6-2-2) Connecting Arms 111A and 111B

In the present embodiment, the connecting arm 111A extends along the Y-axis.

The connecting arm 111A is connected to the long side 121c of the vibrating portion 120 in a vicinity of a central part of the busbar B1 at one end thereof, and extends toward the node forming portion 130A. The other end of the connecting arm 111A is connected to the connection side 131a of the node forming portion 130A in a direction substantially perpendicular to the connection side 131a.

In the present embodiment, the connecting arm 111B extends along the Y-axis.

The connecting arm 111B is connected to the long side 121d of the vibrating portion 120 in a vicinity of a central part of the short side of the upper electrode E1b at one end thereof, and extends toward the node forming portion 130B. The other end of the connecting arm 111B is connected to the connection side 131*b* of the node forming portion 130B in a direction substantially perpendicular to the connection side 131*b*.

Other structures of the connecting arms 111A and 111B are similar to those in the first embodiment.

(6-3) Laminated Structure

Figure 13:
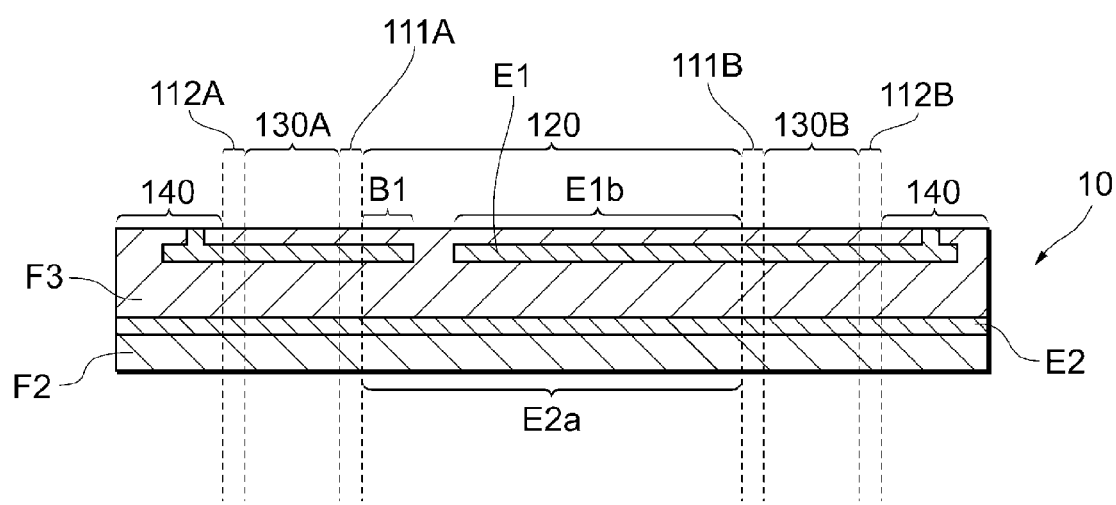
FIG. 13 is a sectional view of FIG. 12.

The laminated structure (sectional structure) of the resonance device 1 will now be described with reference to FIG. 13. FIG. 13 is a sectional view of FIG. 12 taken along line C-C'.

In the present embodiment, as illustrated in FIG. 13, a metal layer E2 is formed so as to function as, for example, the lower electrode E2*a* on the vibrating portion 120. The metal layer E2 is also formed so as to function as a lead wire on the node forming portion 130B, the connecting arm 111B, and the holding arm 112B.

A metal layer E1 is formed so as to function as, for example, the upper electrode E1*b* and the busbar B1 on the vibrating portion 120. The metal layer E1 is also formed so as to function as a lead wire on the node forming portion 130A, the connecting arm 111A, and the holding arm 112A.

Other structures and functions are similar to those in the first embodiment.

Seventh Embodiment

Figure 14:
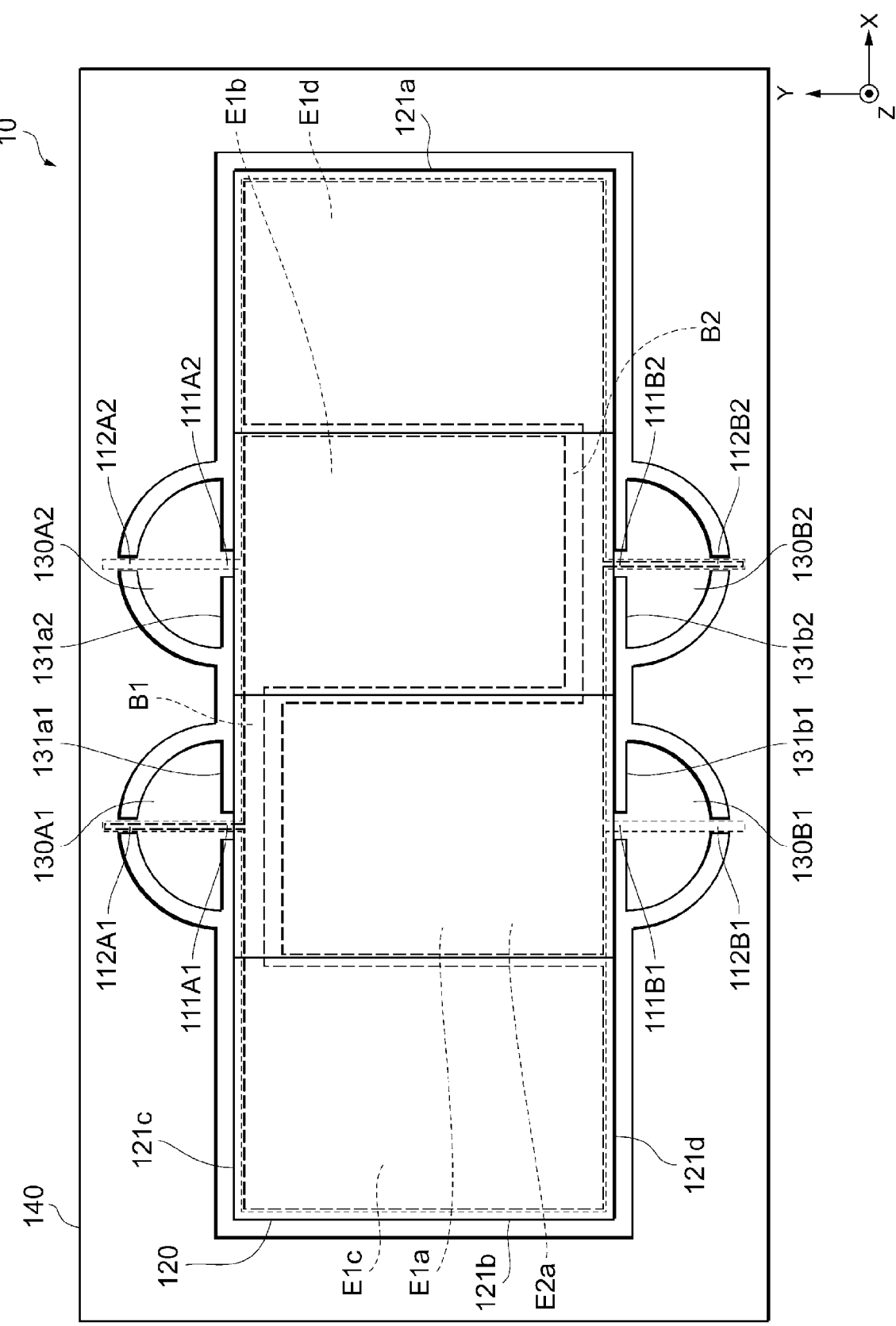
FIG. 14 is a plan view corresponding to FIG. 4 and illustrating a resonator according to a seventh exemplary embodiment from which an upper substrate is removed.

FIG. 14 illustrates an example of a plan view of a resonator 10 according to the present embodiment. The differences between the detailed structure of a resonance device 1 according to the present embodiment and that of the first embodiment will now be mainly described.

In the present embodiment, the resonator 10 includes node forming portions 130A1, 130A2, 130B1, and 130B2, connecting arms 111A1, 111A2, 111B1, and 111B2, and holding arms 112A1, 112A2, 112B1, and 112B2 as components corresponding to the node forming portions 130A and 130B, the connecting arms 111A and 111B, and the holding arms 112A and 112B according to the first embodiment.

(7-1) Lower Cover 20

In the present embodiment, the recess 21 in the lower cover 20 has two circular segments R on each of the pair of long sides of the rectangle S so that the shape thereof is similar to that of a combination of the vibrating portion 120 and the node forming portions 130A1, 130A2, 130B1, and 130B2. Other structures of the lower cover are similar to those in the first embodiment.

(7-2) Resonator 10

(7-2-1) Vibrating Portion 120

In the present embodiment, four rectangular-plate-shaped upper electrodes E1*a*, E1*b*, E1*c*, and E1*d* having a length direction and a width direction are provided on the vibrating portion 120. A lower electrode E2*a* is provided below the upper electrodes E1*a*, E1*b*, E1*c*, and E1*d* so as to oppose the upper electrodes E1*a*, E1*b*, E1*c*, and E1*d*. Referring to FIG. 14, the vibrating portion 120 has a pair of short sides 121*a* and 121*b* extending in the Y-axis direction and a pair of long sides 121*c* and 121*d* extending in the X-axis direction.

The upper electrodes E1*a*, E1*b*, E1*c*, and E1*d* have long sides extending in the Y-axis direction and short sides extending in the X-axis direction.

The upper electrodes E1*b* and E1*c* are connected to each other by a busbar B1. The busbar B1 is provided on an end part of the vibrating portion 120 near the node forming portions 130A1 and 130A2 so as to oppose the upper electrode E1*a*. The busbar B1 is connected to a line that extends to a part of the holding portion 140 that opposes the long side 121*c* of the vibrating portion 120 through the connecting arm 111A1, the node forming portion 130A1, and the holding arm 112A1.

The upper electrodes E1*a* and E1*d* are connected to each other by a busbar B2. The busbar B2 is provided on an end part of the vibrating portion 120 near the node forming portions 130B1 and 130B2 so as to oppose the upper electrode E1*b*. The busbar B2 is connected to a line that extends to a part of the holding portion 140 that opposes the long side 121*d* of the vibrating portion 120 through the connecting arm 111B2, the node forming portion 130B2, and the holding arm 112B2.

The lower electrode E2*a* has long sides extending in the X-axis direction and short sides extending in the Y-axis direction. The lower electrode E2*a* is formed on the vibrating portion 120, and is connected to lines that extend from the vibrating portion 120 to parts of holding portion 140 that oppose the long sides 121*c* and 121*d* through the connecting arms 111A1, 111A2, 111B1, and 111B2, the node forming portions 130A1, 130A2, 130B1, and 130B2, and the holding arms 112A1, 112A2, 112B1, and 112B2.

Other structures of the vibrating portion 120 are similar to those in the first embodiment.

(7-2-2) Connecting Arms 111A1, 111A2, 111B1, and 111B2

In the present embodiment, the connecting arms 111A1 and 111A2 extend along the Y-axis.

The connecting arm 111A1 is connected to the long side 121*c* of the vibrating portion 120 in a vicinity of a central part of the busbar B1, and extends toward the node forming portion 130A1. The other end of the connecting arm 111A1 is connected to the connection side 131*a*1 of the node forming portion 130A1 in a direction substantially perpendicular to the connection side 131*a*1. The structure of the connecting arm 111A2 is similar to that in the fifth embodiment. Other structures of the connecting arms 111A1 and 111A2 are similar to those in the first embodiment.

The structure of the connecting arm 111B2 is similar to that of the connecting arm 111A1. The structure of the connecting arm 111B1 is similar to that of the connecting arm 111A2.

(7-2-3) Holding Arms 112A1, 112A2, 112B1, and 112B2

The structures of the holding arms 112A1, 112A2, 112B1, and 112B2 are similar to those in the fifth embodiment.

Other structures are similar to those in the first embodiment.

The above-described embodiments are intended to facilitate understanding of the present invention, and not to limit the interpretation of the present invention. The present invention may be modified/improved without departing from the gist thereof, and includes equivalents to the present invention. In other words, the present invention includes the embodiments to which a person skilled in the art has made a design change as appropriate as long as they have characteristics of the present invention. For example, the elements included in the embodiments and arrangements, materials, conditions, shapes, sizes, etc., thereof are not limited to the illustrated examples, and may be changed as appropriate.

Furthermore, it is needless to say that the embodiments are illustrative, and that structures described in different embodiments may be partially replaced or applied in combination. These are also included in the present invention as long as they have the characteristics of the present invention.

REFERENCE SIGNS LIST 1 resonance device
10 resonator 30 upper cover
20 lower cover
140 holding portion
111A, 111B connecting arm
112A, 112B holding arm
130A, 130B node forming portion
120 vibrating portion
F1 SiO2 film
F2 Si layer
F3 piezoelectric thin film
E1, E2 metal layer

The invention claimed is:

1. A resonator comprising:
a piezoelectric vibrator;
a frame surrounding at least a portion of the piezoelectric vibrator;
a first node generator disposed between the piezoelectric vibrator and the frame;
a first connecting arm that extends in a first direction and that connects the first node generator to a side of the piezoelectric vibrator that opposes the first node generator; and
a first holding arm that connects the first node generator to a side of the frame that opposes the first node generator,
wherein the first node generator comprises a width extending in a second direction, which is orthogonal to the first direction, with the width being a maximum width at a portion of the first node generator closer to the first connecting arm than a center of the first node generator relative to the first direction, and
wherein the width of the first node generator gradually decreases from the maximum width as the first node generator extends towards the first holding arm.

2. The resonator according to claim 1, further comprising:
a second node generator disposed between the piezoelectric vibrator and the frame, such that the second node generator opposes a side of the piezoelectric vibrator that is opposite the side of the piezoelectric vibrator that opposes the first node generator;
a second connecting arm that connects the piezoelectric vibrator to the second node generator; and
a second holding arm that extends in the first direction and that connects the second node generator to the frame,
wherein the second node generator comprises a width extending in the second direction that is a maximum width at a portion of the second node generator closer to the second connecting arm than a center of the second node generator relative to the first direction, and
wherein the width of the second node generator gradually decreases from the maximum width as the second node generator extends towards the second holding arm.

3. The resonator according to claim 2,
wherein the first node generator comprises a semi-circular shape that is connected to the first connecting arm in a vicinity of a midpoint of a chord of the semi-circular shape and to the first holding arm in a vicinity of a vertex of an arc of the semi-circular shape segment, and
wherein the second node generator comprises a semi-circular shape that is connected to the second connecting arm in a vicinity of a midpoint of a chord of the semi-circular shape and to the second holding arm in a vicinity of a vertex of an arc of the semi-circular shape.

4. The resonator according to claim 2,
wherein the first node generator comprises a triangular shape that is connected to the first connecting arm in a vicinity of a midpoint of a base of the triangular shape and to the first holding arm in a vicinity of a vertex of the triangular shape, and
wherein the second node generator comprises a triangular shape that is connected to the second connecting arm in a vicinity of a midpoint of a base of the triangular shape and to the second holding arm in a vicinity of a vertex of the triangular shape.

5. The resonator according to claim 2, wherein, in each of the first and second node generators, the respective maximum widths extending in the second direction is less than a width of the piezoelectric vibrator in the second direction.

6. The resonator according to claim 2, wherein the piezoelectric vibrator comprises a plurality of stacked layers including a piezoelectric thin film and a pair of electrodes disposed on opposing surfaces of the piezoelectric thin film.

7. The resonator according to claim 2,
wherein the piezoelectric vibrator comprises a rectangular shape with a plurality of vibrating regions extending along long sides of the rectangular shape, and
wherein each of the first and second connecting arms includes a first arm that extends substantially parallel to the long sides, a plurality of second arms that connect the first arm to the plurality of vibrating regions, and a third arm that connects the first arm to the first and second node generators, respectively.

8. The resonator according to claim 7, wherein, in each of the first and second node generators, the respective maximum widths in the second direction is greater than a width of the respective third arm.

9. The resonator according to claim 1, wherein the first connecting arm and the first holding arm both extend in the first direction and are aligned with each other in the first direction.

10. The resonator according to claim 1, wherein the first connecting arm comprises a pair of connecting arms that are each connected to the piezoelectric vibrator at respective connection points that are each offset from a midpoint of the side of the piezoelectric vibrator that opposes the first node generator.

11. The resonator according to claim 10, wherein the pair of connecting arms are not aligned with the first holding arm in the first direction.

12. The resonator according to claim 1, wherein:
the first node generator is a semi-circle,
the first connecting arm connects a midpoint of a base of the semi-circle to a midpoint of the side of the piezoelectric vibrator that opposes the first node generator, and
wherein the first holding arm connects a vertex of the semi-circle to the frame.

13. A resonance device comprising the resonator according to claim 1, a lower cover, and an upper cover, with the resonator being interposed therebetween.

14. A resonator comprising:
a piezoelectric vibrator;
a first vibrational node generator disposed between a first side of the piezoelectric vibrator and a frame;
a first connecting arm that extends in a first direction and that connects the first vibrational node generator to the first side of the piezoelectric vibrator; and
a first holding arm that connects the first vibrational node generator to the frame,
wherein the first vibrational node generator comprises a base that is parallel to the first side of piezoelectric vibrator and that extends in a second direction orthogonal to the first direction, and wherein a width of the first vibrational node generator extending in the second direction decreases as the first vibrational node generator extends from the base towards the first holding arm.

15. The resonator according to claim 14, wherein the width of the first vibrational node generator is a maximum width at a portion of the first vibrational node generator closer to the first connecting arm than a center of the first vibrational node generator relative to the first direction.

16. The resonator according to claim 15, wherein the first vibrational node generator comprises a semi-circular shape that is connected to the first connecting arm in a vicinity of a midpoint of a chord of the semi-circular shape and to the first holding arm in a vicinity of a vertex of an arc of the semi-circular shape segment.

17. The resonator according to claim 15, wherein the first vibrational node generator comprises a triangular shape that is connected to the first connecting arm in a vicinity of a midpoint of a base of the triangular shape and to the first holding arm in a vicinity of a vertex of the triangular shape.

18. The resonator according to claim 15, wherein maximum width of the first vibrational node generator extending in the second direction is less than a width of the piezoelectric vibrator in the second direction.

19. The resonator according to claim 14, wherein the piezoelectric vibrator comprises a plurality of stacked layers including a piezoelectric thin film and a pair of electrodes disposed on opposing surfaces of the piezoelectric thin film.

20. The resonator according to claim 14, further comprising:
a second vibrational node generator disposed between the piezoelectric vibrator and the frame, such that the second vibrational node generator opposes a second side of the piezoelectric vibrator that is opposite the first side of the piezoelectric vibrator;
a second connecting arm that connects the second side of the piezoelectric vibrator to the second vibrational node generator; and
a second holding arm that extends in the first direction and that connects the second vibrational node generator to the frame,
wherein the second vibrational node generator comprises a base that is parallel to the second side of piezoelectric vibrator and that extends in the second direction, and
wherein a width of the second vibrational node generator extending in the second direction decreases as the second vibrational node generator extends from the base towards the second holding arm.

* * * * *